United States Patent
Choy et al.

(10) Patent No.: US 9,219,464 B2
(45) Date of Patent: Dec. 22, 2015

(54) BULK ACOUSTIC WAVE (BAW) RESONATOR STRUCTURE HAVING AN ELECTRODE WITH A CANTILEVERED PORTION AND A PIEZOELECTRIC LAYER WITH MULTIPLE DOPANTS

(71) Applicant: Avago Technologies General IP (Singapore) Pte. Ltd., Singapore (SG)

(72) Inventors: John Choy, Westminster, CO (US); Chris Feng, Fort Collins, CO (US); Phil Nikkel, Loveland, CO (US); Kevin Grannen, Thornton, CO (US); Kristina Lamers, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 55 days.

(21) Appl. No.: 14/069,312

(22) Filed: Oct. 31, 2013

(65) Prior Publication Data

US 2014/0125202 A1    May 8, 2014

Related U.S. Application Data

(63) Continuation-in-part of application No. 12/626,035, filed on Nov. 25, 2009, now Pat. No. 8,902,023, and a continuation-in-part of application No. 13/662,460, filed on Oct. 27, 2012, now Pat. No. 9,136,819.

(51) Int. Cl.
*H03H 9/15* (2006.01)
*H03H 9/54* (2006.01)
(Continued)

(52) U.S. Cl.
CPC .............. *H03H 9/02015* (2013.01); *B81B 7/02* (2013.01); *H03H 9/02118* (2013.01); *H03H 9/02149* (2013.01); *H03H 9/132* (2013.01); *H03H 9/173* (2013.01); *H03H 9/175* (2013.01)

(58) Field of Classification Search
CPC .......... H03H 9/02015; H03H 9/02047; H03H 9/02086; H03H 9/132; H03H 9/173; H03H 9/175; H03H 9/02118; H03H 9/02149; B81B 7/02
USPC .................................................. 333/187–189
See application file for complete search history.

(56) References Cited

U.S. PATENT DOCUMENTS 4,490,641 A    12/1984    Takeuchi et al.
5,162,691 A    11/1992    Mariani et al.
(Continued)

FOREIGN PATENT DOCUMENTS

JP    1-157108    6/1989
JP    8-319158    12/1996
(Continued)

OTHER PUBLICATIONS

IEEE Xplore Abstract for "Reactive Magnetron Sputtering of Piezoelectric Cr-doped AlN Thin Films", published in 2011 IEEE International Ultrasonics Symposium, Oct. 18-21, 2011, 1 page.*

(Continued)

*Primary Examiner* — Barbara Summons

(57) ABSTRACT

A bulk acoustic wave (BAW) resonator, comprises: a first electrode; a second electrode comprising a plurality of sides. At least one of the sides comprises a cantilevered portion. The bulk acoustic wave (BAW) resonator also comprises a piezoelectric layer disposed between the first and second electrodes. The piezoelectric layer comprises a piezoelectric material doped with a plurality of rare earth elements, and the cantilevered portion extends above the piezoelectric layer. The bulk acoustic wave (BAW) resonator comprises a gap between the cantilevered portion and the piezoelectric layer.

39 Claims, 13 Drawing Sheets

(51) Int. Cl.
*H03H 9/02* (2006.01)
*B81B 7/02* (2006.01)
*H03H 9/13* (2006.01)
*H03H 9/17* (2006.01)

(56) References Cited

U.S. PATENT DOCUMENTS

| | | | |
|---|---|---|---|
| 5,587,620 | A | 12/1996 | Ruby et al. |
| 5,873,153 | A | 2/1999 | Ruby et al. |
| 5,910,756 | A | 6/1999 | Ella |
| 6,074,971 | A | 6/2000 | Chiu et al. |
| 6,107,721 | A | 8/2000 | Lakin |
| 6,129,886 | A | 10/2000 | Tachimoto et al. |
| 6,215,375 | B1 | 4/2001 | Larson, III et al. |
| 6,262,637 | B1 | 7/2001 | Bradley et al. |
| 6,384,697 | B1 | 5/2002 | Ruby |
| 6,507,983 | B1 | 1/2003 | Ruby et al. |
| 6,583,688 | B2 * | 6/2003 | Klee et al. ............ 333/188 |
| 6,709,557 | B1 | 3/2004 | Kailsam et al. |
| 6,709,776 | B2 | 3/2004 | Noguchi et al. |
| 6,811,719 | B2 | 11/2004 | Uchino et al. |
| 6,828,713 | B2 | 12/2004 | Bradley et al. |
| 6,936,837 | B2 * | 8/2005 | Yamada et al. ............ 257/2 |
| 7,002,437 | B2 | 2/2006 | Takeuchi et al. |
| 7,180,224 | B2 | 2/2007 | Bouche et al. |
| 7,275,292 | B2 | 10/2007 | Ruby et al. |
| 7,280,007 | B2 | 10/2007 | Feng et al. |
| 7,281,304 | B2 | 10/2007 | Kim et al. |
| 7,358,831 | B2 | 4/2008 | Larson, III et al. |
| 7,388,454 | B2 | 6/2008 | Ruby et al. |
| 7,459,990 | B2 | 12/2008 | Wunnicke et al. |
| 7,468,608 | B2 | 12/2008 | Feucht et al. |
| 7,557,055 | B2 | 7/2009 | Zhang et al. |
| 7,567,023 | B2 | 7/2009 | Iwaki et al. |
| 7,575,292 | B2 | 8/2009 | Furukawa |
| 7,629,865 | B2 | 12/2009 | Ruby |
| 7,737,807 | B2 | 6/2010 | Larson et al. |
| 7,758,979 | B2 * | 7/2010 | Akiyama et al. ............ 428/699 |
| 7,966,722 | B2 | 6/2011 | Hart et al. |
| 8,076,828 | B2 | 12/2011 | Kawada |
| 8,084,919 | B2 | 12/2011 | Nishihara et al. |
| 8,248,185 | B2 | 8/2012 | Choy et al. |
| 8,384,497 | B2 | 2/2013 | Zhang |
| 8,902,023 | B2 | 12/2014 | Choy et al. |
| 2002/0158716 | A1 | 10/2002 | Pensala |
| 2002/0165080 | A1 | 11/2002 | Sengupta et al. |
| 2005/0057324 | A1 | 3/2005 | Onishi et al. |
| 2006/0038636 | A1 | 2/2006 | Tsurumi et al. |
| 2006/0132262 | A1 | 6/2006 | Fazzio et al. |
| 2006/0226932 | A1 | 10/2006 | Fazzio et al. |
| 2007/0037311 | A1 | 2/2007 | Izumi et al. |
| 2007/0205850 | A1 | 9/2007 | Jamneala et al. |
| 2007/0247260 | A1 | 10/2007 | Yanase et al. |
| 2007/0252476 | A1 | 11/2007 | Iwaki et al. |
| 2007/0279153 | A1 | 12/2007 | Ruby |
| 2008/0024042 | A1 | 1/2008 | Isobe et al. |
| 2008/0129414 | A1 | 6/2008 | Lobl et al. |
| 2008/0129417 | A1 | 6/2008 | Taniguchi |
| 2008/0143215 | A1 | 6/2008 | Hara et al. |
| 2008/0258842 | A1 | 10/2008 | Ruby et al. |
| 2009/0267453 | A1 | 10/2009 | Barber et al. |
| 2010/0033063 | A1 | 2/2010 | Nishihara et al. |
| 2010/0107389 | A1 | 5/2010 | Nessler et al. |
| 2010/0327697 | A1 | 12/2010 | Choy et al. |
| 2010/0327994 | A1 | 12/2010 | Choy et al. |
| 2011/0148547 | A1 | 6/2011 | Zhang |
| 2011/0180391 | A1 | 7/2011 | Larson, III et al. |
| 2012/0104900 | A1 | 5/2012 | Nishihara et al. |
| 2012/0194297 | A1 | 8/2012 | Choy et al. |
| 2013/0038408 | A1 | 2/2013 | Burak et al. |
| 2013/0127300 | A1 | 5/2013 | Umeda et al. |
| 2014/0125202 | A1 | 5/2014 | Choy et al. |
| 2014/0125203 | A1 | 5/2014 | Choy et al. |

FOREIGN PATENT DOCUMENTS

| | | |
|---|---|---|
| JP | 2006-186412 | 7/2006 |
| JP | 2008-066792 | 3/2008 |
| JP | 2008-131194 | 6/2008 |
| JP | 2009201101 | 9/2009 |
| WO | WO2011004601 | 1/2011 |

OTHER PUBLICATIONS

Dimitriu, et al., "Complex Rare-earth Substituted Lead Titanate Piezoceramics", 2004 IEEE International Ultrasonics, Ferroelectrics, and Frequency Control Joint 50th Anniversary Conference, 2004, 297-300.

Kabulski, et al., "Erbium Alloyed Aluminum Nitride Films for Piezoelectric Applications", Mater. Res. Soc. Symp. Proc. vol. 1129 (c) 2009 Materials Research Society, 2009, 1-5.

Al-Ahmad, et al. "Piezoelectric-Based Tunable Microstrip Shunt Resonator", Proceedings of the Asia-Pacific Microwave Conference 2006, 4 pages.

Ferenc Tasnadi et al., "Origin of the anomalous piezoelectric response in wurtzite ScxAl1-xN alloys", Department of Physics, Chemistry and Biology (IFM),Linkoping University, Publication date: Mar. 18, 2010, http://arxiv.org/pdf/1003.3353.pdf, pp. 1-10.

V. V. Felmetsger et al., "Reactive Magnetron Sputtering of Piezoelectric Cr-Doped AlN Thin Films", PVD Product Group OEM Group Incorporated, http://www.oemgroupinc.com/dopedAlN.pdf, pp. 1-5, published in 2011 IEEE International Ultrasonics Symposium, Oct. 18-21, 2011.

Tuomas Pensala, "Thin Film Bulk Acoustic Wave Devices: Performance Optimization and Modeling", VTT Publications 756, http://www.vtt.fi/inf/pdf/publications/2011/P756.pdf, pp. 1-108, dissertation presented on Feb. 25, 2011.

Unofficial/non-certified translation of Office Action mailed Aug. 28, 2015 in Chinese Patent Application No. 201210581765.X (provided by foreign agent), 7 pages.

Machine translation of JP2006-186412, published Jul. 13, 2006, 8 pages.

Machine translation of JP2008-131194, published Jun. 5, 2008, 15 pages.

Machine translation of JP2008-066792, published Mar. 21, 2008, 31 pages.

Office Action mailed Aug. 28, 2015 in Chinese Patent Application No. 201210581765.X, 8 pages.

* cited by examiner

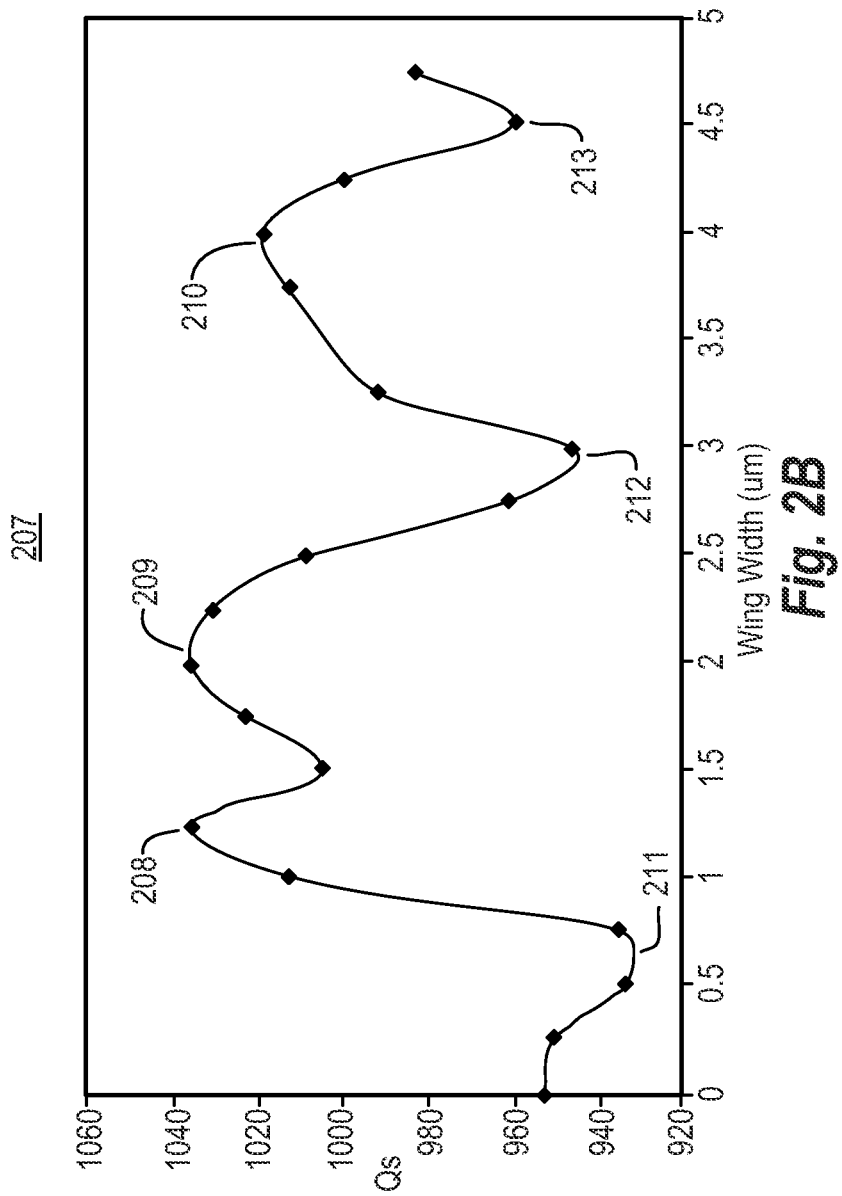

BULK ACOUSTIC WAVE (BAW) RESONATOR STRUCTURE HAVING AN ELECTRODE WITH A CANTILEVERED PORTION AND A PIEZOELECTRIC LAYER WITH MULTIPLE DOPANTS

CROSS-REFERENCE TO RELATED APPLICATIONS

The present application is a continuation-in-part of and claims priority under 35 U.S.C. §120 from U.S. patent application No. 12/626,035 entitled "ACOUSTIC RESONATOR STRUCTURE HAVING AN ELECTRODE WITH A CANTILEVERED PORTION" to John Choy, et al. and filed on Nov. 25, 2009. The present application is also a continuation-in-part of and claims priority under 35 U.S.C. §120 from U.S. patent application Ser. No. 13/662,460 entitled "BULK ACOUSTIC WAVE RESONATOR HAVING PIEZOELECTRIC LAYER WITH MULTIPLE DOPANTS" to John Choy, et al. and filed on Oct. 27, 2012. The disclosure of these parent applications are specifically incorporated herein by reference.

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a bulk acoustic wave (BAW) resonator. Typically, there are two types of BAW resonators: a Film Bulk Acoustic Resonator (FBAR) and a solidly mounted bulk acoustic resonator (SMR). Both the FBAR and the SMR comprise acoustic stacks that are disposed over a reflective element. The reflective element of an FBAR is a cavity, normally in a substrate over which the acoustic stack is mounted. The reflective element of an SMR is a Bragg reflector comprising alternating layers of high acoustic impedance and low acoustic impedance.

BAW resonators haves the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

Desirably, the BAW resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, in addition to the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material. Among other adverse effects, lateral modes deleteriously impact the quality (Q) factor of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

Generally, a bulk acoustic wave (BAW) resonator has a layer of piezoelectric material between two conductive plates (electrodes), which may be formed on a thin membrane. The piezoelectric material may be a thin film of various materials, such as aluminum nitride (AlN), zinc oxide (ZnO), or lead zirconate titanate (PZT), for example. Thin films made of AlN are advantageous since they generally maintain piezoelectric properties at high temperature (e.g., above 400° C.). However, AlN has a lower piezoelectric coefficient $d_{33}$ than both ZnO and PZT, for example.

An AlN thin film may be deposited with various specific crystal orientations, including a wurtzite (0001) B4 structure, which consists of a hexagonal crystal structure with alternating layers of aluminum (Al) and nitrogen (N), and a zincblende structure, which consists of a symmetric structure of Al and N atoms, for example. Due to the nature of the Al—N bonding in the wurtzite structure, electric field polarization is present in the AlN crystal, resulting in the piezoelectric properties of the AlN thin film. To exploit this polarization and the corresponding piezoelectric effect, one must synthesize the AlN with a specific crystal orientation. Generally, a higher piezoelectric coupling coefficient ($d_{33}$) is desirable, since the higher the piezoelectric coefficient $d_{33}$, the less material is required to provide the same piezoelectric effect.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2B shows a graph of the Q-factor at series resonance ($Q_s$) versus width of the cantilevered portion(s) of a bulk acoustic wave (BAW) resonator in accordance with a representative embodiment.

DEFINED TERMINOLOGY

Figure 1A:
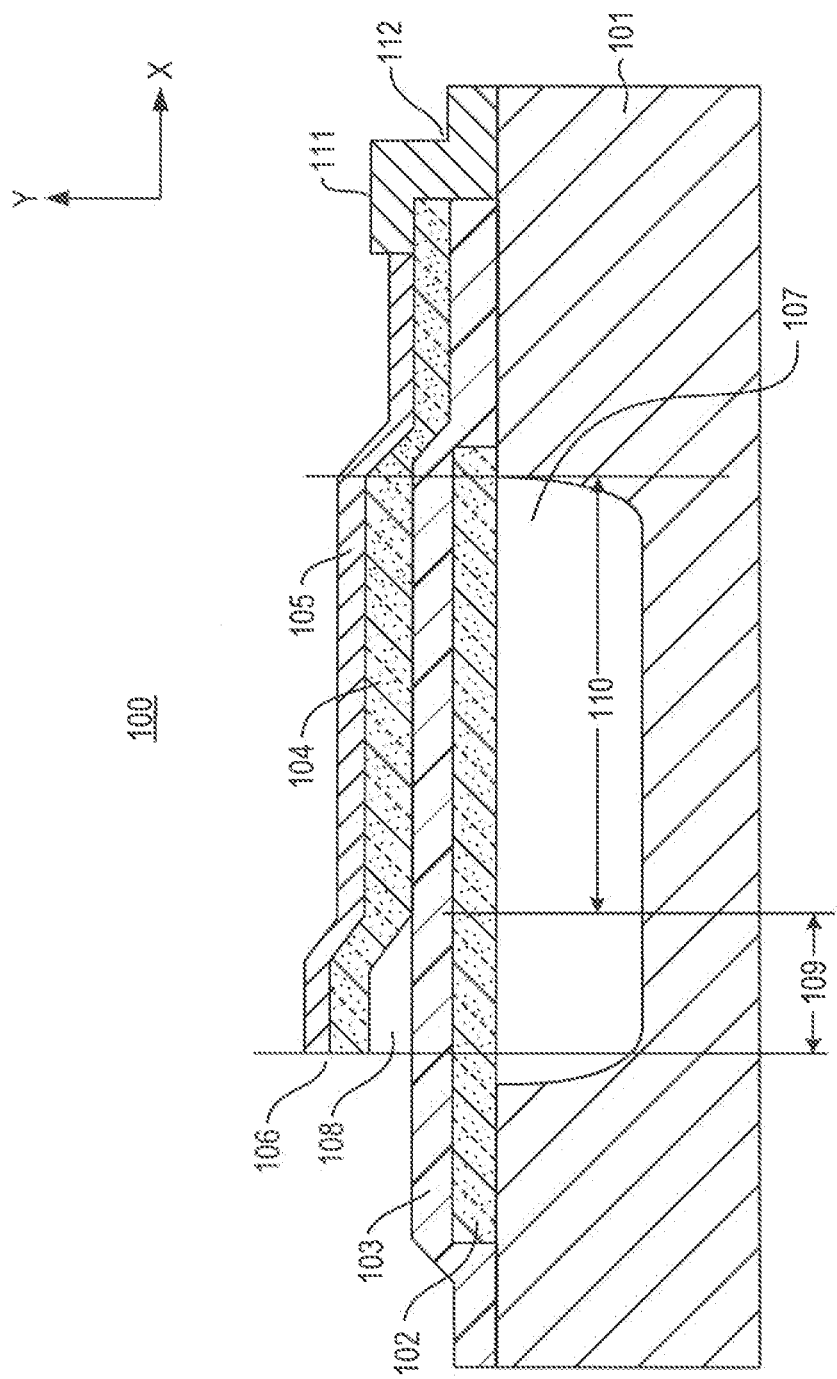
FIG. 1A shows a cross-sectional view of a bulk acoustic wave (BAW) resonator in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The BAW Resonator

FIG. 1A is a cross-sectional view along the line 1B-1B of a bulk acoustic wave (BAW) resonator 100 in accordance with a representative embodiment. Illustratively, the bulk acoustic wave (BAW) resonator 100 comprises an FBAR. The bulk acoustic wave (BAW) resonator 100 comprises a substrate 101, a first electrode 102 disposed beneath a piezoelectric layer 103, which comprises a first surface in contact with a first electrode 102 and a second surface in contact with a second electrode 104. As described more fully below, the piezoelectric layer 103 comprises a piezoelectric material that is doped with multiple dopants.

An optional passivation layer 105 is provided over the second electrode 104. A cantilevered portion 106 of the second electrode 104 is provided on at least one side of the second electrode 104. The cantilevered portion 106 may also be referred to as a 'wing.'

The bulk acoustic wave (BAW) resonator 100 may be fabricated according to known semiconductor processing methods and using known materials. Illustratively, the bulk acoustic wave (BAW) resonator 100 may be fabricated according to the teachings of commonly owned U.S. Pat. Nos. 5,587,620; 5,873,153; 6,384,697; 6,507,983; and 7,275,292 to Ruby, et al.; and U.S. Pat. No. 6,828,713 to Bradley, et al. The disclosures of these patents are specifically incorporated herein by reference. It is emphasized that the methods and materials described in these patents are representative and other methods of fabrication and materials within the purview of one of ordinary skill in the art are contemplated.

When connected in a selected topology, a plurality of bulk acoustic wave (BAW) resonators 100 can act as an electrical filter. For example, the bulk acoustic wave (BAW) resonators 100 may be arranged in a ladder-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers.

The first and second electrodes 102, 104 each comprise an electrically conductive material (e.g., molybdenum (Mo)) and provide an oscillating electric field in the y-direction of the coordinate system shown (i.e., the direction of the thickness of the substrate 101). In the illustrative embodiment described presently, the y-axis is the axis for the TE (longitudinal) mode(s) for the resonator. In a representative embodiment, the piezoelectric layer 103 and first and second electrodes 102,104 are suspended over a cavity 107, which functions as a reflective element. The cavity 107 is formed by selective etching of the substrate 101. The cavity 107 may be formed by a number of known methods, for example as described in referenced commonly owned U.S. Pat. No. 6,384,697 to Ruby, et al. Accordingly, the bulk acoustic wave (BAW) resonator 100 is a mechanical resonator, which can be electrically coupled via the piezoelectric layer 103. Other configurations that foster mechanical resonance by BAW resonators are contemplated. For example, the bulk acoustic wave (BAW) resonator 100 can be located over another type of reflective element, such as a mismatched acoustic Bragg reflector (not shown in FIG. 1A) formed in or on the substrate 101. BAW resonators provided over an acoustic mirror are sometimes referred to as solidly mount resonators (SMRs) and, for example, may be as described in U.S. Pat. No. 6,107, 721 to Lakin, the disclosure of which is specifically incorporated into this disclosure by reference in its entirety.

The cantilevered portion 106 of the second electrode 104 extends over a gap 108, which illustratively comprises air. In a representative embodiment, a sacrificial layer (not shown) is deposited by known technique over the first electrode 102 and a portion of the piezoelectric layer 103. The second electrode 104 and passivation layer 105 are provided over the sacrificial layer. Illustratively, the sacrificial material comprises phosphosilicate glass (PSG), which illustratively comprises 8% phosphorous and 92% silicon dioxide. After the formation of the second electrode 104 and passivation layer 105, the sacrificial layer is etched away illustratively with hydrofluoric acid leaving the cantilevered portion 106. In a representative embodiment, the sacrificial layer provided to form the cantilevered portion 106 and the sacrificial layer provided to form the cavity 107 are removed in the same process step.

Notably, rather than air, the gap 108 may comprise other materials including low acoustic impedance materials, such as carbon (C) doped $SiO_2$, which is also referred as Blackdiamond; or dielectric resin commercially known as SiLK™; or benzocyclobutene (BCB). Such low acoustic impedance materials may be provided in the gap 108 by known methods. The low acoustic impedance material may be provided after removal of sacrificial material used to form the gap 108, or may be used instead of the sacrificial material in the gap 108, and not removed.

The region of contacting overlap of the first and second electrodes 102, 104, the piezoelectric layer 103 and the cavity 107, or other reflective element (e.g., Bragg reflector (not shown)) is referred to as an active area 110 of the bulk acoustic wave (BAW) resonator 100. By contrast, an inactive area of the bulk acoustic wave (BAW) resonator comprises a region of overlap between first electrode 102 or second electrode 104, or both, and the piezoelectric layer 103 not disposed over the cavity 107, or other suspension structure, or acoustic mirror. As described more fully in the parent application, it is beneficial to the performance of the bulk acoustic wave (BAW) resonator 100 to reduce the area of the inactive region of the bulk acoustic wave (BAW) resonator 100 to the extent practical.

The cantilevered portion 106 extends beyond an edge of the active area 110 by a width 109 as shown. An electrical contact 111 is connected to a signal line (not shown) and electronic components (not shown) selected for the particular application of the bulk acoustic wave (BAW) resonator 100. This portion of the bulk acoustic wave (BAW) resonator 100 comprises an interconnection side 112 of the bulk acoustic wave (BAW) resonator 100. As will become clearer as the present description continues, the interconnection side 112 of the second electrode 104 to which the electrical contact 111 is made does not comprise a cantilevered portion. By contrast, one or more non-connecting sides of the bulk acoustic wave (BAW) resonator 100 may comprise cantilevered portions 106 that extend beyond the edge of the active area 110.

Figure 1B:
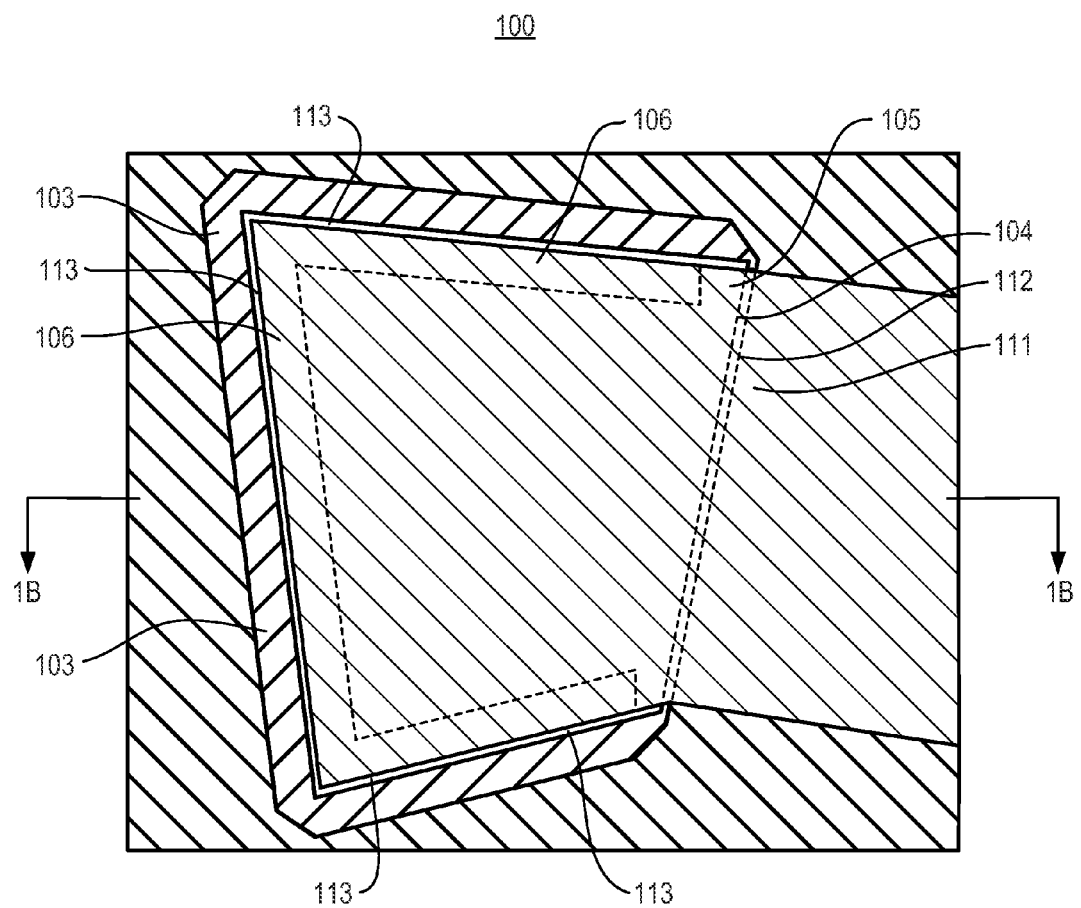
FIG. 1B shows a top view of a bulk acoustic wave (BAW) resonator in accordance with a representative embodiment.

FIG. 1B shows a top view of the bulk acoustic wave (BAW) resonator 100 shown in cross-sectional view in FIG. 1A and in accordance with a representative embodiment. The bulk acoustic wave (BAW) resonator 100 also comprises the second electrode 104 with the optional passivation layer 105 disposed thereover. The second electrode 104 of the present embodiment is illustratively apodized to reduce acoustic losses. Further details of the use of apodization in bulk acoustic wave (BAW) resonators may be found in commonly owned U.S. Pat. No. 6,215,375 to Larson III, et al; or in commonly owned U.S. Pat. No. 7,629,865 entitled "Piezoelectric Resonator Structures and Electrical Filters," to Richard C. Ruby. The disclosures of these patents are specifically incorporated herein by reference in their entirety.

The second electrode 104 comprises non-connecting sides 113 and interconnection side 112. In a representative embodiment, cantilevered portions 106 are provided along each non-contacting side 113 and have the same width. This is merely illustrative, and it is contemplated that at least one side 113, but not all comprise a cantilevered portion 106. Furthermore, it is contemplated that the second electrode 104 comprises more or fewer than four sides as shown. For example, a pentagonal-shaped second electrode is contemplated comprising four sides with cantilevered portions on one or more of the sides, and the fifth side providing the interconnection side. In a representative embodiment, the shape of the first electrode 102 is substantially identical to the shape of the second electrode 104. Notably, the first electrode 102 may comprise a larger area than the second electrode 104, and the shape of the first electrode 102 may be different than the shape of the second electrode 104.

The fundamental mode of the bulk acoustic wave (BAW) resonator 100 is the longitudinal extension mode or "piston" mode. This mode is excited by the application of a time-varying voltage to the two electrodes at the resonant frequency of the bulk acoustic wave (BAW) resonator 100. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f=v_{ac}/(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy as the frequency is varied for the case in which one electrode is connected to ground and another to signal, for an FBAR resonator with an impedance equal to the system impedance at the resonant frequency. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q-factor of the device. For instance, and in addition to the sources of acoustic losses mentioned above, Rayleigh-Lamb (lateral or spurious) modes are in the x,y dimensions of the piezoelectric layer 103. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 (symmetric) mode and the zeroth and (asymmetric) modes, A0 and A1), which are due to the difference in effective velocities between the regions where electrodes are disposed and the surrounding regions of the resonator where there are no electrodes. At a specific frequency, the acoustic wave length of a bulk acoustic wave (BAW) resonator is determined by v/f, where v is acoustic velocity and f is frequency. It is believed that periodicity of Qp (i.e., the position of maxima and minima as a function of the width of the cantilevered portion 106) is related to the acoustic wave length. At a maxima of Qp, the vibration of the cantilevered portion 106 is comparatively far from its mechanical resonance; while at a minima mechanical resonance of the cantilevered portion 106 occurs. This phenomenon can be appreciated from a review of FIG. 2A below, for example: as frequency decreases, acoustic wave length increases, and the width of the cantilevered portion 106 at a maxima increases accordingly.

Regardless of their source, the lateral modes are parasitic in many resonator applications. For example, the parasitic lateral modes couple at the perimeter of the resonator and remove energy available for the longitudinal modes and thereby reduce the Q-factor of the resonator device. Notably, as a result of parasitic lateral modes and other acoustic losses sharp reductions in Q can be observed on a Q-circle of the Smith Chart of the $S_{11}$ parameter. These sharp reductions in Q-factor are known as "rattles" or "loop-de-loops," which are shown and described below.

The cantilevered portion(s) 106 of the representative embodiments provide a change in the acoustic impedance at the boundary of the active area 110 of the bulk acoustic wave (BAW) resonator 100. As a result, reflections of lateral modes at the boundary are promoted. In a representative embodiment, the boundary of the active area 110 of the bulk acoustic wave (BAW) resonator and the cantilevered portion 106 is solid (electrodes and piezoelectric layer) and air, which presents a comparatively large impedance mismatch and a comparatively high reflection coefficient. As a result, lateral modes are comparatively highly reflected, which improves the Q-factor by two mechanisms. First, because the reflected lateral modes are not transmitted, their energy is not lost. Improving the losses by reducing transmission of lateral modes outside the active area 110 of the bulk acoustic wave (BAW) resonator 100 can increase the Q-factor of the bulk acoustic wave (BAW) resonator 100. Second, a portion of the reflected lateral modes is converted into desired longitudinal modes. The greater the wave energy is in longitudinal modes, the higher the Q-factor. As a result, the cantilevered portion(s) 106 of the bulk acoustic wave (BAW) resonator 100 enhances the Q-factor of both the parallel and the series resonance (i.e., $Q_p$ and $Q_s$).

Figure 2A:
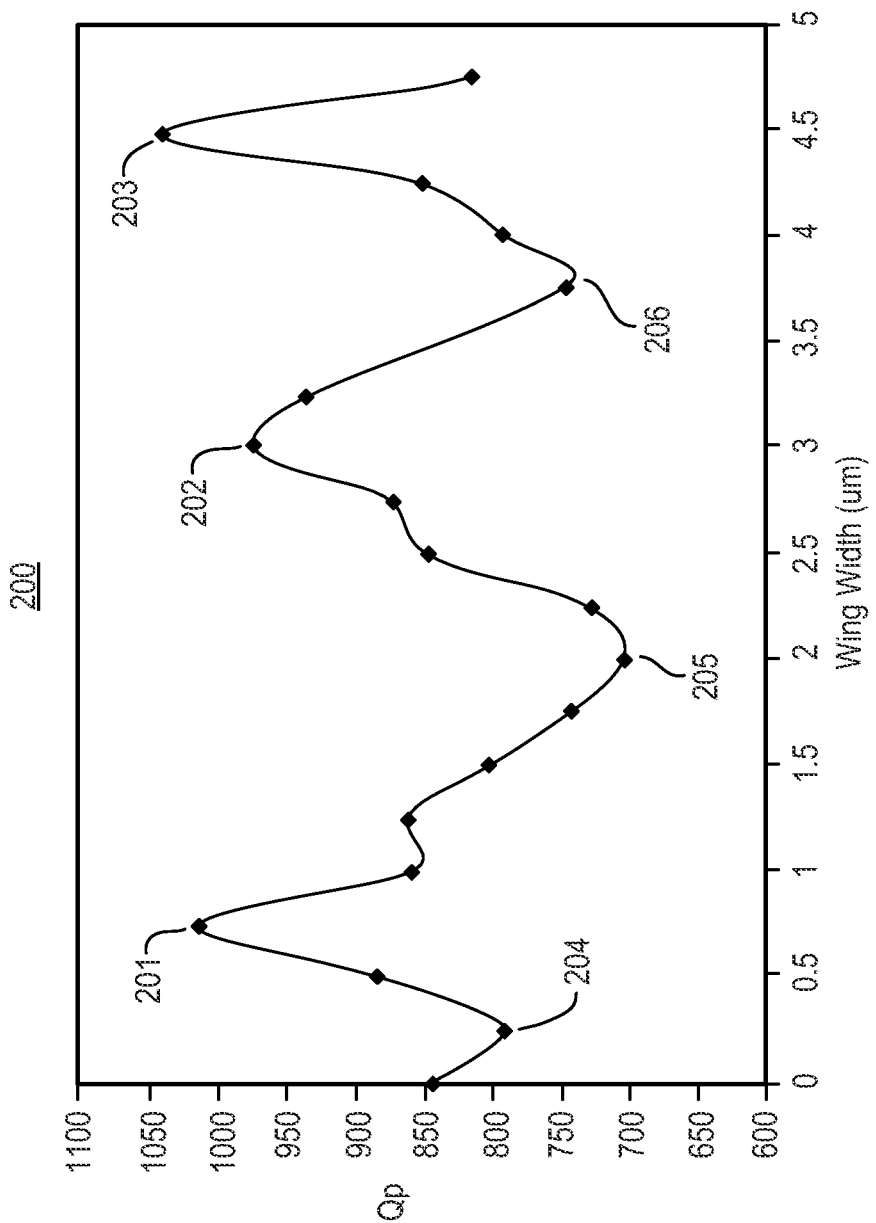
FIG. 2A shows a graph of the Q-factor at parallel resonance ($Q_p$) versus width of the cantilevered portion(s) of a bulk acoustic wave (BAW) resonator in accordance with a representative embodiment.

FIG. 2A shows a graph 200 of the Q-factor at parallel resonance ($Q_p$) versus width (e.g., width 109, also referred to as "wing width") of the cantilevered portion(s) 106 ("wings") of a bulk acoustic wave (BAW) resonator in accordance with a representative embodiment. The graph 200 provides data of a bulk acoustic wave (BAW) resonator comprising three cantilevered portions 106, such as illustratively shown in FIGS. 1A and 1B. The Q-factor is dependent on the width of the cantilevered portion 106 for a given parallel resonance frequency. As shown, there are relative maxima in $Q_p$ at points 201, 202 and 203; and local minima at points 204, 205 and 206 as the width 109 increases. Notably, $Q_p$ improves significantly at a certain width 109, compared with width 109 of the cantilevered portion 106 being zero, which is equivalent to a bulk acoustic wave (BAW) resonator having substantially the same structure as bulk acoustic wave (BAW) resonator 100 but not comprising the cantilevered portion 106.

Improvements in $Q_p$ due to the inclusion of the cantilevered portion 106 results from different boundary conditions at the edge of the active area 110 of the bulk acoustic wave (BAW) resonator 100 compared to a bulk acoustic wave (BAW) resonator not comprising a cantilevered portion(s). As described above, the cantilevered portion 106 at the edge of active area 110 of the bulk acoustic wave (BAW) resonator will reflect certain acoustic modes due to the impedance mismatch at the boundary of the cantilevered portion 106 and the active area 110, resulting in improved Q. It is believed that the local minima may result from the excitation of a mechanical resonance of the cantilevered portion 106, which results in losses. The excited resonance conditions at relative minima 204, 205, 206, result in energy not reflected back into the active area 110 of the bulk acoustic wave (BAW) resonator 100, losses and reduced Q. Accordingly, when designing bulk acoustic wave (BAW) resonator 100, the width 109 of the cantilevered portion 106 is beneficially selected at a relative maximum 201, 202, 203, and not at a relative minimum 204, 205, 206.

FIG. 2B shows a graph 207 of the Q-factor at series resonance ($Q_s$) versus width (e.g., width 109 ('wing width')) of the cantilevered portion 106 ('wing') of a bulk acoustic wave (BAW) resonator in accordance with a representative embodiment. The graph 207 provides data of a bulk acoustic wave (BAW) resonator comprising three cantilevered portions 106, such as illustratively shown in FIGS. 1A and 1B. The Q-factor is dependent on the width of the cantilevered portion 106 for a given series resonance frequency. As shown, there are relative maxima in Q, at points 208, 209 and 210; and local minima at points 211, 212 and 213 as the width 109 increases. Notably, $Q_s$ improves significantly at a certain width 109, compared with width=0 of the cantilevered portion 106, which is equivalent to a bulk acoustic wave (BAW) resonator having substantially the same configuration as bulk acoustic wave (BAW) resonator 100 but without cantilevered portions 106.

As described above, the cantilevered portion 106 at the edge of active area 110 of the bulk acoustic wave (BAW) resonator will reflect certain acoustic modes due to the impedance mismatch at the boundary of the cantilevered portion 106 and the active area 110, resulting in improved Q. It is believed that the local minima may result from the excitation of a mechanical resonance of the cantilevered portion 106, which results in losses. The excited resonance conditions at relative minima 211, 212 and 213 result in energy not reflected back into the active area 110 of the bulk acoustic wave (BAW) resonator 100, losses and, therefore, reduced Q. Accordingly, when designing bulk acoustic wave (BAW) resonator 100, the width 109 of the cantilevered portion 106 is beneficially selected at a relative maximum 208, 209 or 210, and not at a relative minimum 211, 212 or 213.

Moreover, because the cantilevered portion 106 does not generate spurious lateral modes, there is no attendant degradation in Q near the series resonance frequency as can occur with the inclusion of known raised frame elements (sometimes referred to as 'outies') and known recessed frame elements (sometimes referred to as 'innies'.) Notably, both raised frame elements and recessed frame elements may be disposed annularly about the bulk acoustic wave (BAW) resonator and are sometimes referred to as annular recesses and annular frames. The raised frame elements and recessed frame elements may generate spurious modes, but recessed frame elements improve the coupling coefficient ($k_t^2$), and raised frame elements may slightly decrease $k_t^2$. Furthermore the cantilevered portion 106 does not generate spurious modes because its location is not within the active area 110. The cantilevered portion 106 also does not degrade $k_t^2$ as significantly as the raised and recessed frame elements. As can be appreciated from a review of FIG. 2A, $k_t^2$ at peak Q corresponds to a width of the cantilevered portion 106 of approximately 4.75 µm and is approximately 5.2. This represents an increase in $k_t^2$ of approximately 10% greater than that of a known bulk acoustic wave (BAW) resonator with a raised frame element.

Figure 3A:
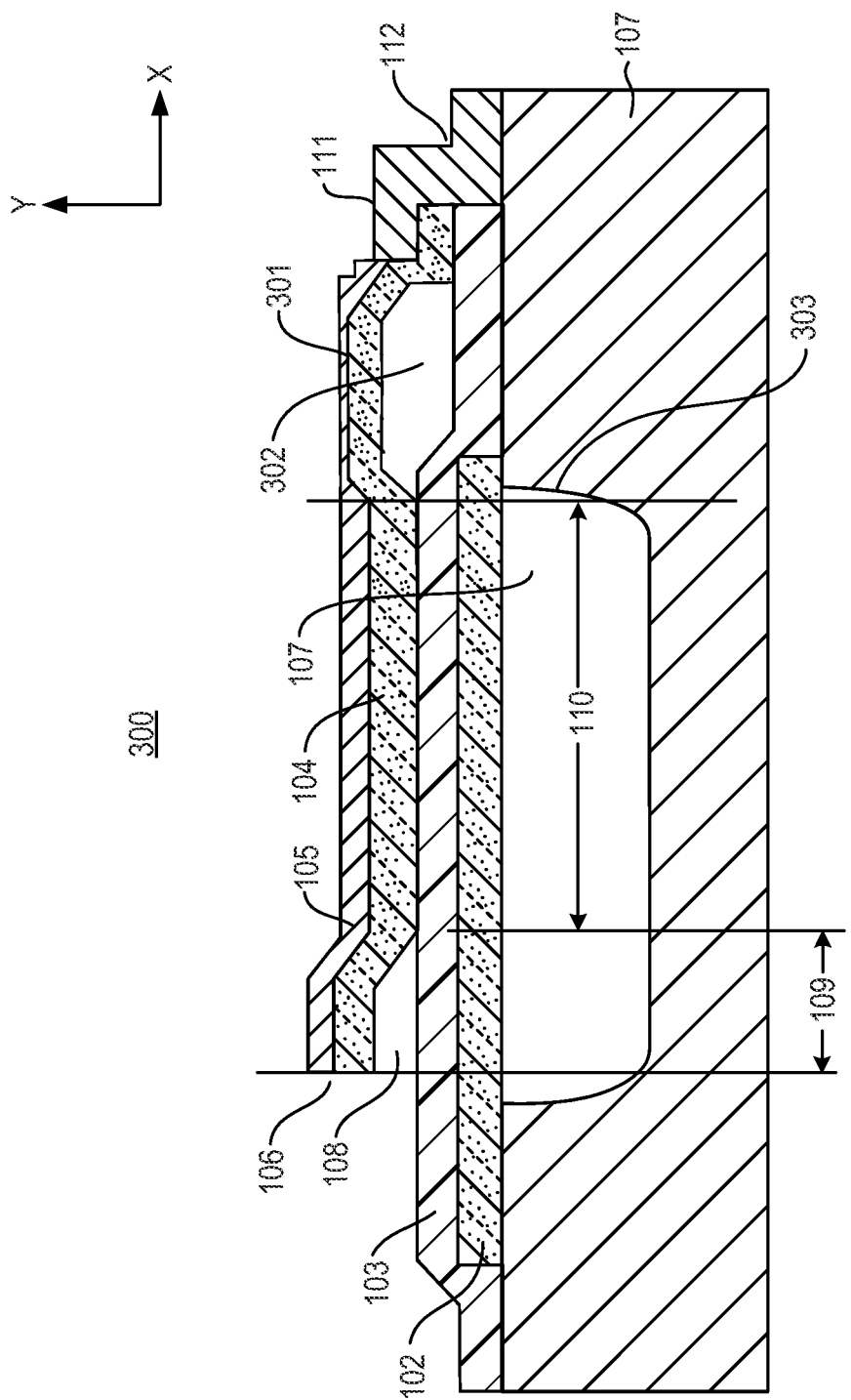
FIG. 3A shows a cross-sectional view of a bulk acoustic wave (BAW) resonator in accordance with a representative embodiment.

FIG. 3A shows a cross-sectional view of a bulk acoustic wave (BAW) resonator 300 in accordance with a representative embodiment. Many of the features of the bulk acoustic wave (BAW) resonator 300 are common to those of bulk acoustic wave (BAW) resonator 100 described in connection with representative embodiments in FIGS. 1A-1B. The details of common features, characteristics and benefits thereof are not repeated in order to avoid obscuring the presently described embodiments.

The bulk acoustic wave (BAW) resonator 300 comprises a bridge 301 along the interconnection side 112. The bridge 301 provides a gap 302, which may be a void (e.g., air) or may be filled with a low acoustic impedance material. The bridge 301 is described in the parent application (now U.S. Pat. No. 8,248,185), and as such many of the details of the bridge 301 are not repeated in the present application to avoid obscuring the description of the representative embodiments of the bulk acoustic wave (BAW) resonator 300. As depicted in FIG. 3A, the cavity 107 has an edge 303, and the bridge 301 extends past the edge 303 of the cavity 107 (or similar reflective element, such as a mismatched Bragg reflector) and over the substrate 101. As such, in a representative embodiment, the bridge 301 is disposed partially over the cavity 107, extends over the edge 303 of the cavity 107, and is disposed partially over the substrate 101.

As described above, the cantilevered portion 106 provides an improvement in the Q-factor. Similarly, the bridge 301 also provides an improvement in the Q-factor. Beneficially, the combination of the cantilevered portion 106 and the bridge 301 provides a further improvement in the Q-factor of the bulk acoustic wave (BAW) resonator 300. To this end, inclusion of the bridge 301 with the cantilevered portion 106 in the bulk acoustic wave (BAW) resonator 300 results in an improvement in the Q-factor at parallel resonance (Qp) and some impact on the Q-factor at series resonance (Qs). This is somewhat expected since the bridge 301 predominantly impacts Qp, as described in the parent application.

Figure 3B:
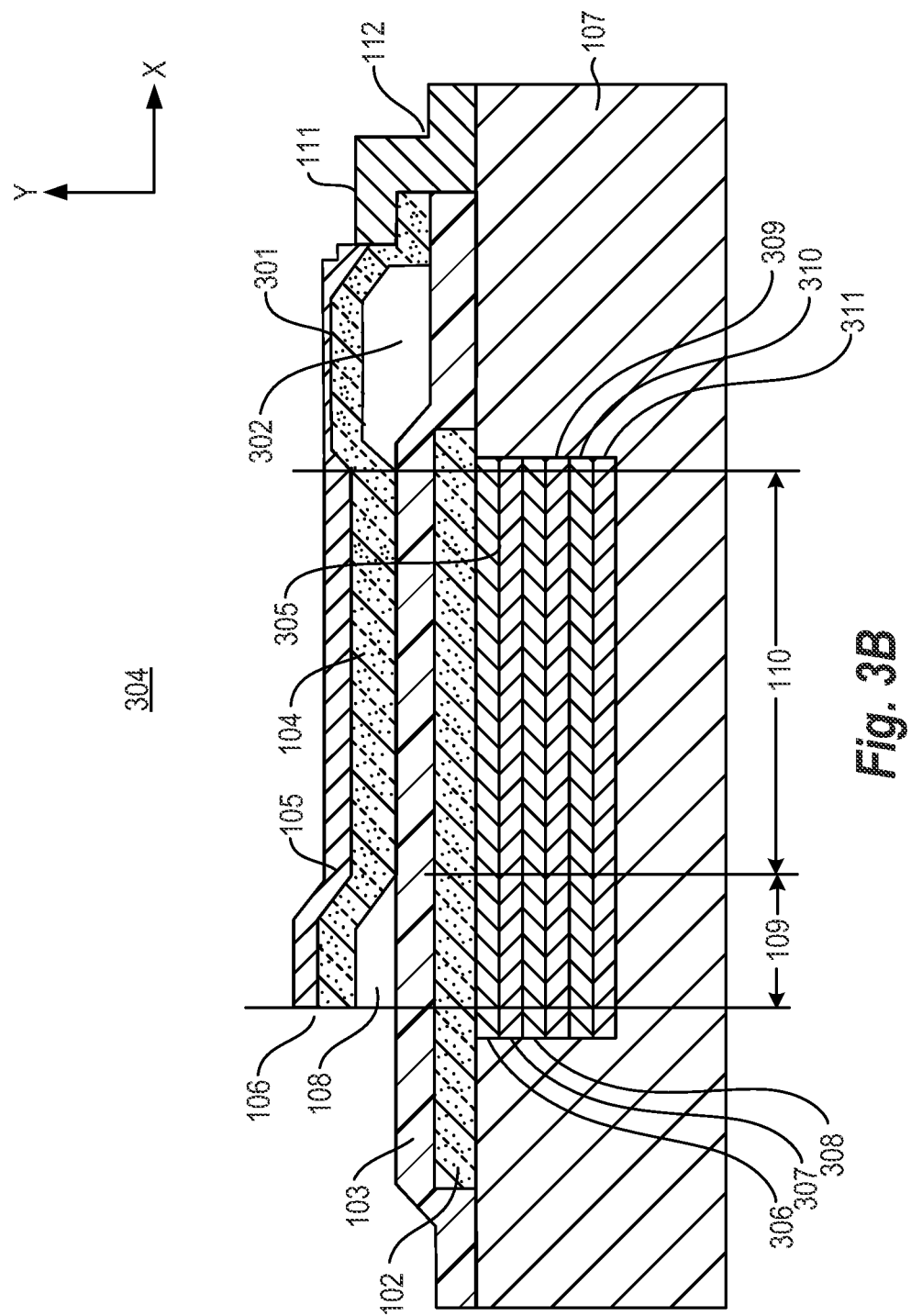
FIG. 3B shows a cross-sectional view of a bulk acoustic wave (BAW) resonator in accordance with a representative embodiment.

FIG. 3B shows a cross-sectional view of a bulk acoustic wave (BAW) resonator 304 in accordance with a representative embodiment. Many of the features of the bulk acoustic wave (BAW) resonator 304 are common to those of bulk acoustic wave (BAW) resonator 100 described in connection with representative embodiments in FIGS. 1A-1B. The details of common features, characteristics and benefits thereof are not repeated in order to avoid obscuring the presently described embodiments.

The bulk acoustic wave (BAW) resonator 304 comprises a bridge 301 along the interconnection side 112. The bridge 301 provides a gap 302, which may be a void (e.g., air) or may be filled with a low acoustic impedance material. The bridge 301 is described in the parent application (now U.S. Pat. No. 8,248,185), and as such many of the details of the bridge 301 are not repeated in the present application to avoid obscuring the description of the representative embodiments of the bulk acoustic wave (BAW) resonator 300. As depicted in FIG. 3A, the bulk acoustic wave (BAW) resonator 304 comprises an acoustic reflector 305. The acoustic reflector 305 has an edge 303, and the bridge 301 extends past the edge 303 of the acoustic reflector 305 and over the substrate 101. As such, in a representative embodiment, the bridge 301 is disposed partially over the acoustic reflector 305, extends over the edge 303 of the cavity 107, and is disposed partially over the substrate 101.

The acoustic reflector 305 may be a distributed Bragg reflector (DBR) or other acoustic mirror, for example, formed of multiple acoustic impedance layers, indicated by representative first through sixth acoustic impedance layers 306 to 311. The first electrode 107 is disposed over the acoustic reflector 305, the piezoelectric layer 103 is disposed over the first electrode 102, and the second electrode 104 is disposed over the piezoelectric layer 103. As should be appreciated by one of ordinary skill in the art, the structure provided by the first electrode 102, the piezoelectric layer 103 and the second electrode 101 forms the acoustic stack of the bulk acoustic wave (BAW) resonator 304.

More particularly, the acoustic reflector 305 is formed in or on the top of the substrate 101 and provides acoustic isolation between the substrate 101 and the acoustic stack. The acoustic impedance layers 306-311 of the acoustic reflector 305 are formed of materials having different acoustic impedances. For example, the acoustic impedance layers 306-311 may have alternating low and high acoustic impedances, such that acoustic impedance layer 306 has relatively low acoustic impedance, acoustic impedance layer 307 has relatively high acoustic impedance, acoustic impedance layer 308 has relatively low acoustic impedance, acoustic impedance layer 309 has relatively high acoustic impedance, acoustic impedance layer 310 has relatively low acoustic impedance, and acoustic impedance layer 311 has relatively high acoustic impedance. These differing acoustic impedances can be obtained, for instance, by forming the odd numbered acoustic impedance layers 307, 309 and 311 of a relatively soft material, and forming the even numbered acoustic impedance layers 306, 308 and 310 of a relatively hard material. Notably, the number of acoustic impedance layers may differ from six, without departing from the scope of the present teachings. Generally, the number of acoustic impedance layers may be determined by a tradeoff between desired mirror performance (e.g., the more layers the better) and cost and processing issues (e.g., the fewer layers the cheaper and more straightforward mirror growth and post-processing).

The amount of acoustic isolation provided by acoustic reflector 305 generally depends on the contrast between the acoustic impedances of adjacent acoustic impedance layers 306-311, with a greater amount of contrast creating better acoustic isolation. In some embodiments, the acoustic reflector 305 is formed in pairs of dielectric materials having contrasting acoustic impedances. For example, the odd acoustic reflector layers 307, 309 and 311 may be formed of a material having low acoustic impedance, such as silicon oxide ($SiO_x$), where x is an integer, while the even acoustic reflector layers 306, 308 and 310, paired with corresponding odd acoustic reflector layers 321, 323 and 325, may be formed of a material having high acoustic impedance, such as tungsten (W) or molybdenum (Mo). In another example, the odd acoustic reflector layers 307, 309 and 311 may be formed of carbon-doped silicon oxide (CDO), while the even acoustic reflector layers 306, 308 and 310 paired with corresponding odd acoustic reflector layers 307, 309 and 311, may be formed of silicon nitride ($SiN_x$), where x is an integer. A benefit of this pair is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. This process may be less expensive (e.g., by about 10 percent) than producing an etched air cavity, for example, thus providing a cost effective substitute for an air cavity.

The acoustic reflector 305 and bulk acoustic wave (BAW) resonator may be fabricated using various alternative techniques, an example of which is described in U.S. Pat. No. 7,358,831 to Larson, III et al., which is hereby incorporated by reference in its entirety. Of course, the low and high acoustic impedance materials forming the stacked layers of the acoustic reflector 320 may vary without departing from the scope of the present teachings. The present teachings contemplate the use of FBARs (e.g., bulk acoustic wave (BAW) resonator 300) or SMRs (e.g., bulk acoustic wave (BAW) resonator) in a variety of applications, including filters (e.g., ladder filters comprising a plurality of BAW resonators).

As described above, the cantilevered portion 106 provides an improvement in the Q-factor. Similarly, the bridge 301 also provides an improvement in the Q-factor. Beneficially, the combination of the cantilevered portion 106 and the bridge 301 provides a further improvement in the Q-factor of the bulk acoustic wave (BAW) resonator 300. To this end, inclusion of the bridge 301 with the cantilevered portion 106 in the bulk acoustic wave (BAW) resonator 300 results in an improvement in the Q-factor at parallel resonance (Qp) and some impact on the Q-factor at series resonance (Qs). This is somewhat expected since the bridge 301 predominantly impacts Qp, as described in the parent application.

Figure 4A:
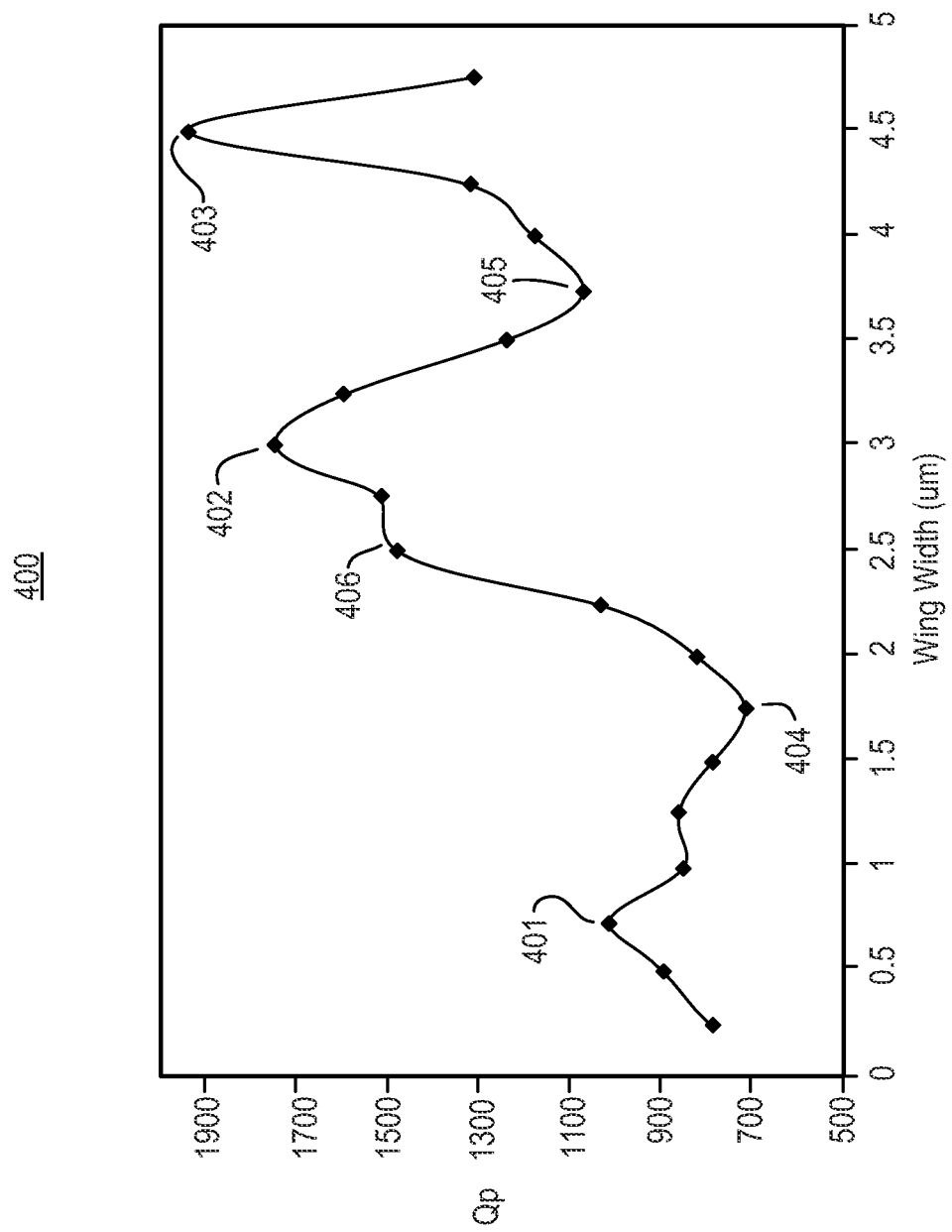
FIG. 4A shows a graph of the Q-factor at parallel resonance ($Q_p$) versus width of the cantilevered portion(s) of a bulk acoustic wave (BAW) resonator in accordance with a representative embodiment.

FIG. 4A shows a graph 400 of the Q-factor at parallel resonance (Qp) versus width (e.g., width 109, ('wing width')) of the cantilevered portion 106 of a bulk acoustic wave (BAW) resonator comprising a bridge (e.g., bulk acoustic wave (BAW) resonator 300) in accordance with a representative embodiment. The graph 400 provides data of a bulk acoustic wave (BAW) resonator comprising three cantilevered portions 106, such as illustratively shown in FIGS. 1A and 1B. The Q-factor is dependent on the wing width for a given parallel resonance frequency. As shown, there are relative maxima in $Q_p$ at points 401, 402 and 403; and relative minima at points 404 and 405 as the width 109 increases. Notably, $Q_p$ improves significantly at a certain width 109, compared with width=0 of the cantilevered portion 106, which is equivalent to a bulk acoustic wave (BAW) resonator having substantially the same configuration shown in FIG. 3 but without cantilevered portions 106.

The synergistic impact of the combination of the bridge 301 and the cantilevered portions 106 on Qp can be appreciated by a comparison of data in FIGS. 2A and 4A. For example, in an embodiment comprising cantilevered portion 106 having a width (e.g., width 109) of approximately 2.5 µm, Qp in FIG. 2A (near point 201, for example) is approximately 850. By contrast, an embodiment comprising bridge 301 and cantilevered portion 106 having a width of approximately 2.5 µm (e.g., near point 406) provides Qp of approximately 1500. Similarly, in an embodiment comprising cantilevered portion 106 having a width (e.g., width 109) of approximately 3.0 µm, Qp in FIG. 2A (near point 202, for example) is approximately 975. By contrast, an embodiment comprising bridge 301 and cantilevered portion 106 having a width of approximately 3.0 µm provides Qp of approximately 1750 (e.g., point 402 in FIG. 4A).

Figure 4B:
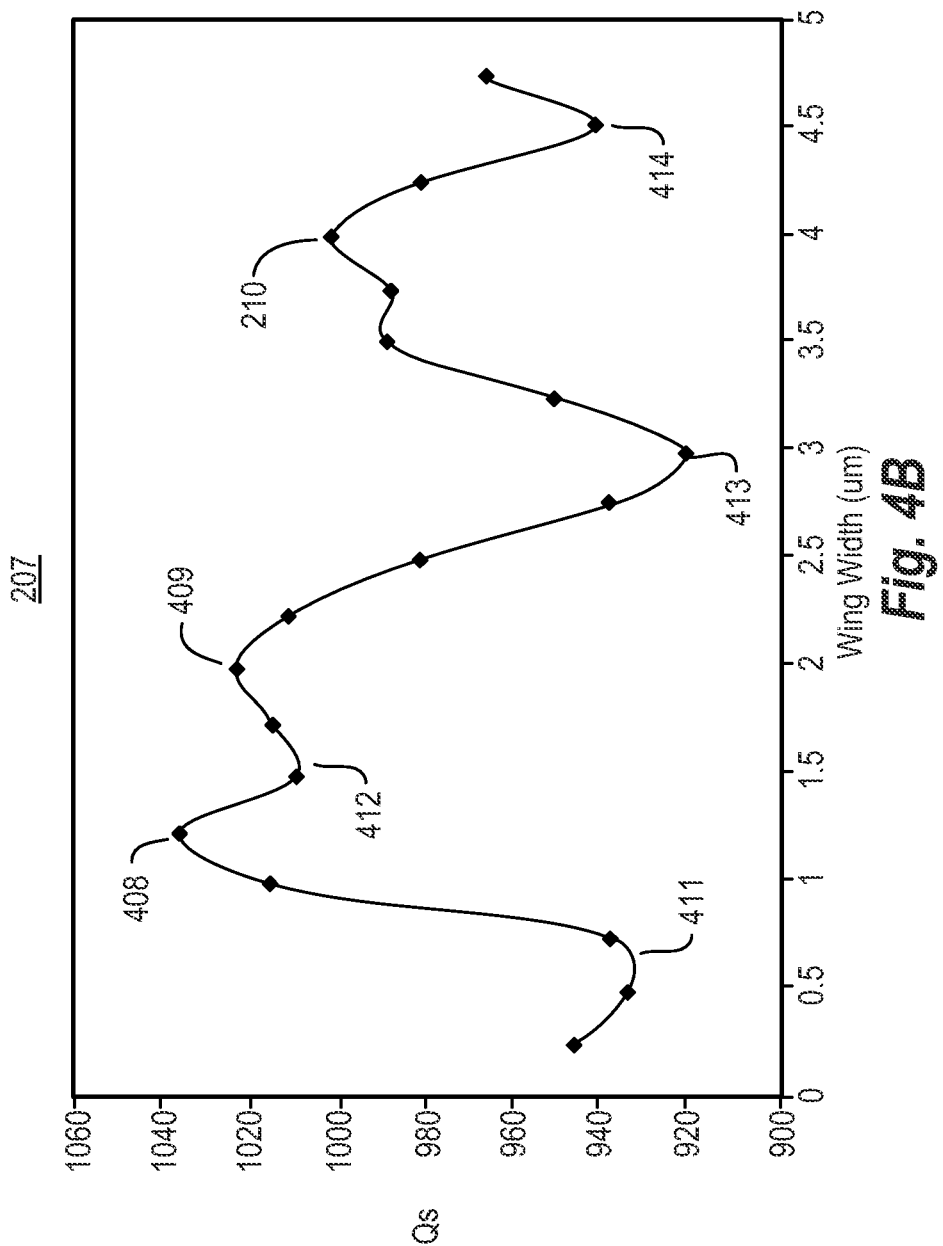
FIG. 4B shows a graph of the Q-factor at series resonance ($Q_s$) versus width of the cantilevered portion(s) of a bulk acoustic wave (BAW) resonator in accordance with a representative embodiment.

FIG. 4B shows a graph 407 of the Q-factor at series resonance ($Q_s$) versus width (e.g., width 109) of the cantilevered portion 106 of a bulk acoustic wave (BAW) resonator comprising a bridge (e.g., bulk acoustic wave (BAW) resonator 300) in accordance with a representative embodiment. The graph 407 provides data of a bulk acoustic wave (BAW) resonator comprising three cantilevered portions 106, such as illustratively shown in FIGS. 1A and 1B. The Q-factor is dependent on the wing width for a given series resonance frequency. As shown, there are relative maxima in Q, at points 408, 409 and 410; and relative minima at points 411, 412, 413 and 414 as the width 109 increases. Notably, $Q_s$ improves significantly at a certain width 109, compared with width=0 of the cantilevered portion 106, which is equivalent to a bulk acoustic wave (BAW) resonator having substantially the same configuration shown in FIG. 3 but without cantilevered portions 106. As noted previously, the impact of the bridge 301 on improved $Q_s$ is less dramatic than its impact on $Q_p$.

Figure 4C:
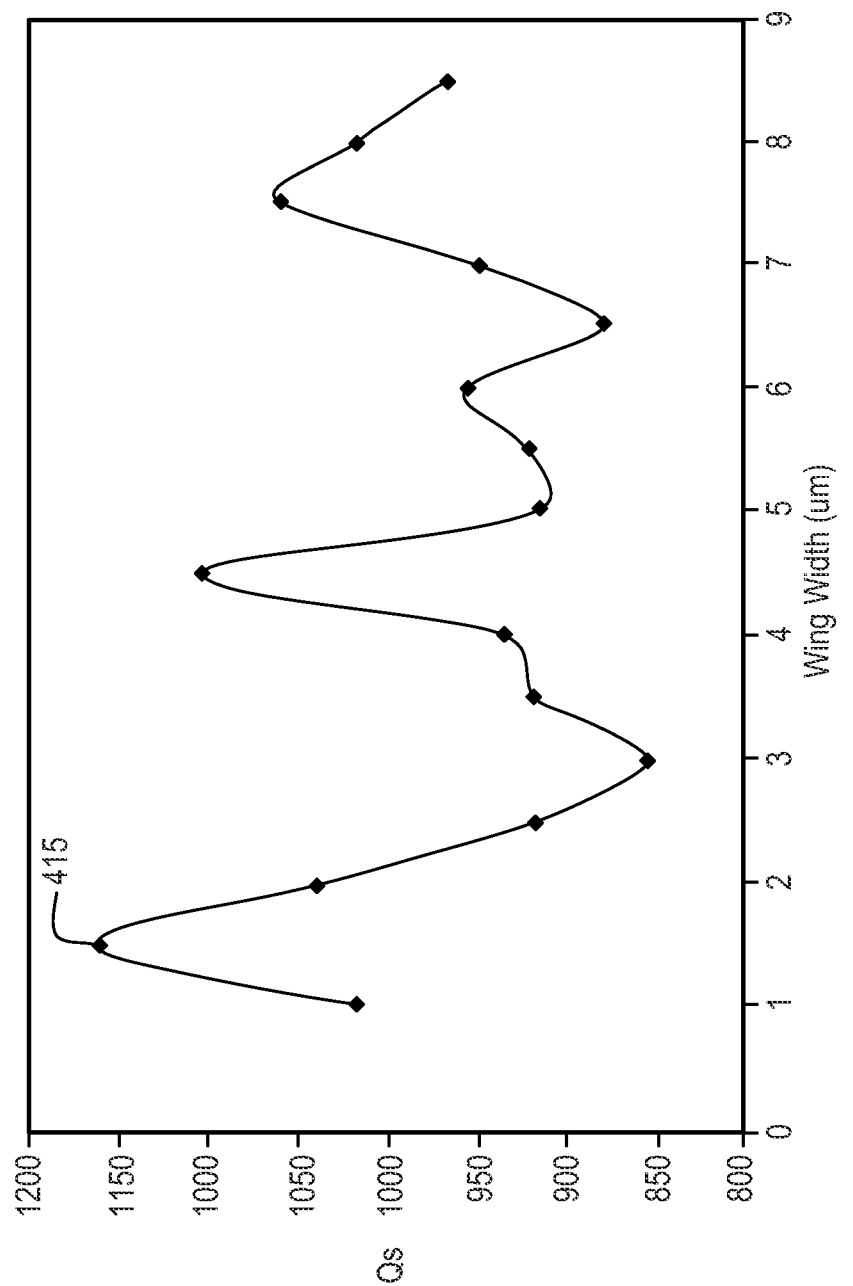
FIG. 4C shows a graph of the Q-factor at parallel resonance ($Q_p$) versus width of the cantilevered portion(s) of a bulk acoustic wave (BAW) resonator in accordance with a representative embodiment.

FIG. 4C shows a graph of the Q-factor at parallel resonance ($Q_p$) versus width of the cantilevered portion(s) of a bulk acoustic wave (BAW) resonator in accordance with a representative embodiment. As the total thickness of the acoustic stack decreases, the resonance frequency increases and, therefore, the acoustic wavelength at the resonance frequency decreases. An optimum width 109 ('wing width') of the cantilevered portion 106, at which the most Q enhancement is achieved, is determined by resonance acoustic quarter-wavelength, therefore smaller optimum wing width is required to achieve optimum Q. Notably, FIG. 4C relates to a bulk acoustic wave (BAW) resonator having a parallel resonance of 800 MHz. A maximum Q-value (shown at point 415) is attained at a wing width of approximately 1.6 µm.

Figure 5A:
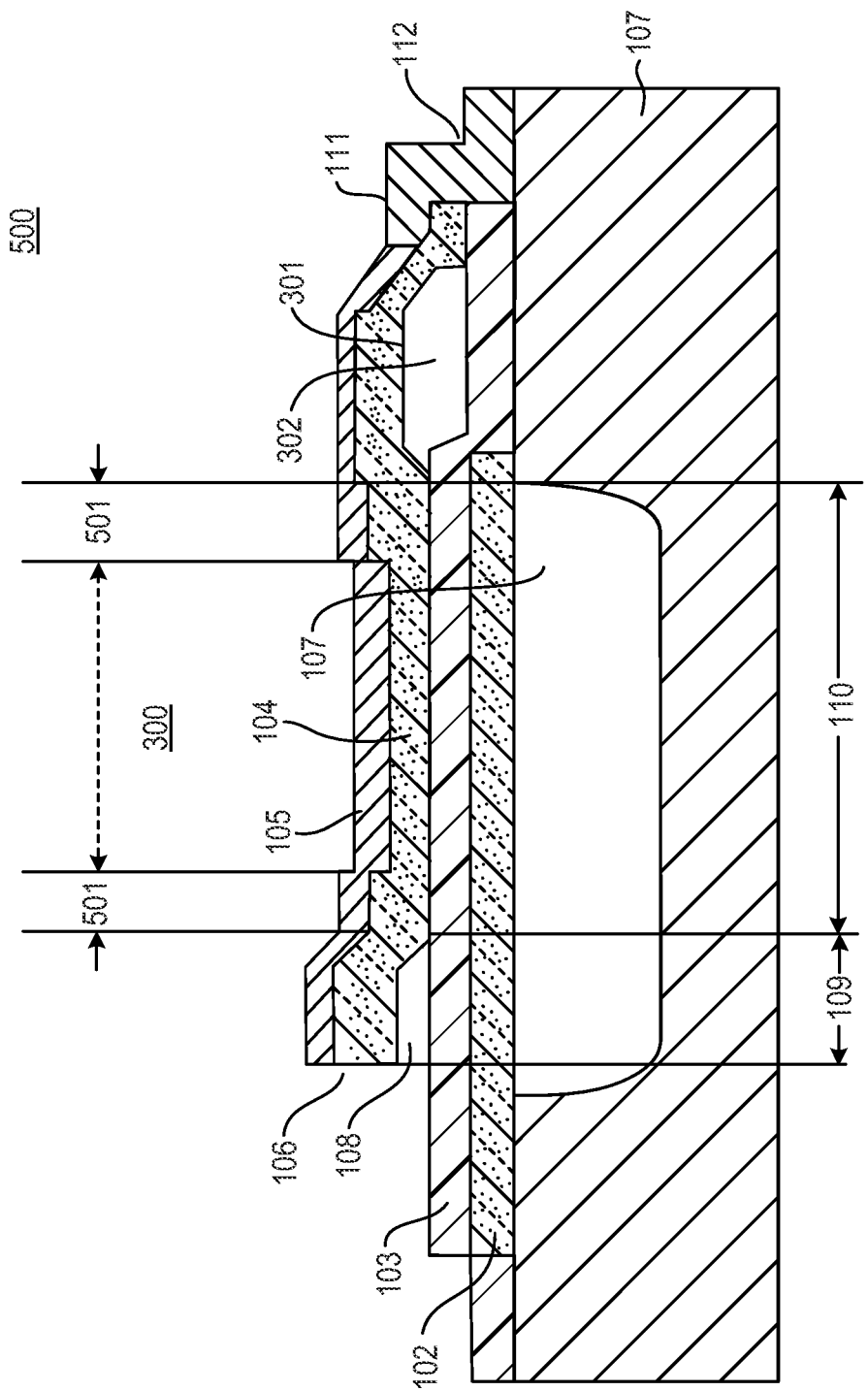
FIG. 5A shows a cross-sectional view of a bulk acoustic wave (BAW) resonator in accordance with a representative embodiment taken along line 5A-5A in FIG. 5B.
Figure 5B:
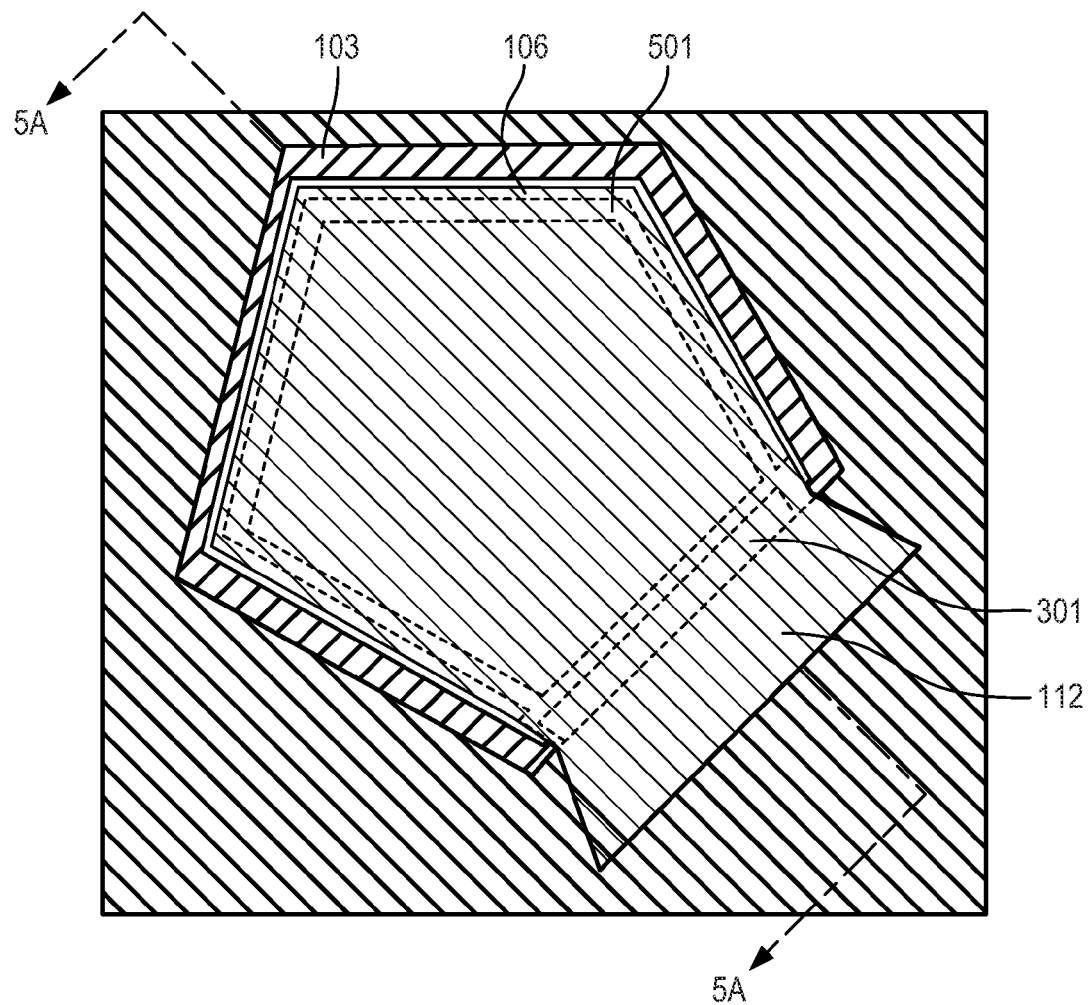
FIG. 5B shows a top view of a bulk acoustic wave (BAW) resonator in accordance with a representative embodiment.

FIG. 5A shows a cross-sectional view of a bulk acoustic wave (BAW) resonator 500 taken along line 5B-5B in accordance with a representative embodiment. FIG. 5B shows a top view of the bulk acoustic wave (BAW) resonator 500. Many of the features of the bulk acoustic wave (BAW) resonator 500 are common to those of bulk acoustic wave (BAW) resonators 100, 300 described in connection with representative embodiments in FIGS. 1A-1B and 3. The details of common features, characteristics and benefits thereof are not repeated in order to avoid obscuring the presently described embodiments.

The bulk acoustic wave (BAW) resonator 500 comprises the bridge 301 along the interconnection side 112. The bridge 301 provides the gap 302, which may be a void (e.g., air) or may be filled with a low acoustic impedance material. In addition to the bridge 301, the bulk acoustic wave (BAW) resonator 500 comprises a raised frame element 501 (commonly referred to as an 'outie'). The raised frame element 501 may be provided over one or more sides of the bulk acoustic wave (BAW) resonator 500 and provides an acoustic mismatch at the boundary of the second electrode 104, thereby improving signal reflections at the boundary and reducing acoustic losses. Ultimately, reduced losses translate into an improved Q-factor of the device. While the raised frame element 501 is shown disposed over the second electrode 104, these features may instead be provided over the first electrode 102 and beneath the piezoelectric layer 103, or selectively on both the first and second electrodes 102,104. Further details of the use, formation and benefits of the raised frame element 501 may be found for example, in commonly owned U.S. Pat. No. 7,280,007 entitled "Thin Film Bulk Acoustic Resonator with a Mass Loaded Perimeter" to Feng, et al.; and commonly owned U.S. Patent Application Publication 20070205850 entitled "Piezoelectric Resonator Structure and Electronic Filters having Frame Elements" to Jamneala, et al. The disclosures of this patent and patent application publication are specifically incorporated herein by reference.

The raised frame element 501 results in an increase in the parallel impedance (Rp) but generates spurious modes below the series resonance frequency: whereas the cantilevered portion 106 increases Rp without degrading Qs. This is because the area of the raised frame element 501 represents a comparatively small fraction of the active area of the bulk acoustic wave (BAW) resonator 500. It can be shown that this is equivalent to a bulk acoustic wave (BAW) resonator connected in parallel to a bulk acoustic wave (BAW) resonator comprising a frame element. Since the resonance frequency of a bulk acoustic wave (BAW) resonator comprising the raised frame element 501 is lower, spurious modes are generated below $f_s$ of the bulk acoustic wave (BAW) resonator without the frame element. The addition of the cantilevered portion 106 to the bulk acoustic wave (BAW) resonator 500 comprising the raised frame element 501 further increases Rp without resulting in additional spurious modes below f because the cantilevered portion 106 lies outside of the active area 110 of the bulk acoustic wave (BAW) resonator 500.

Figure 6:
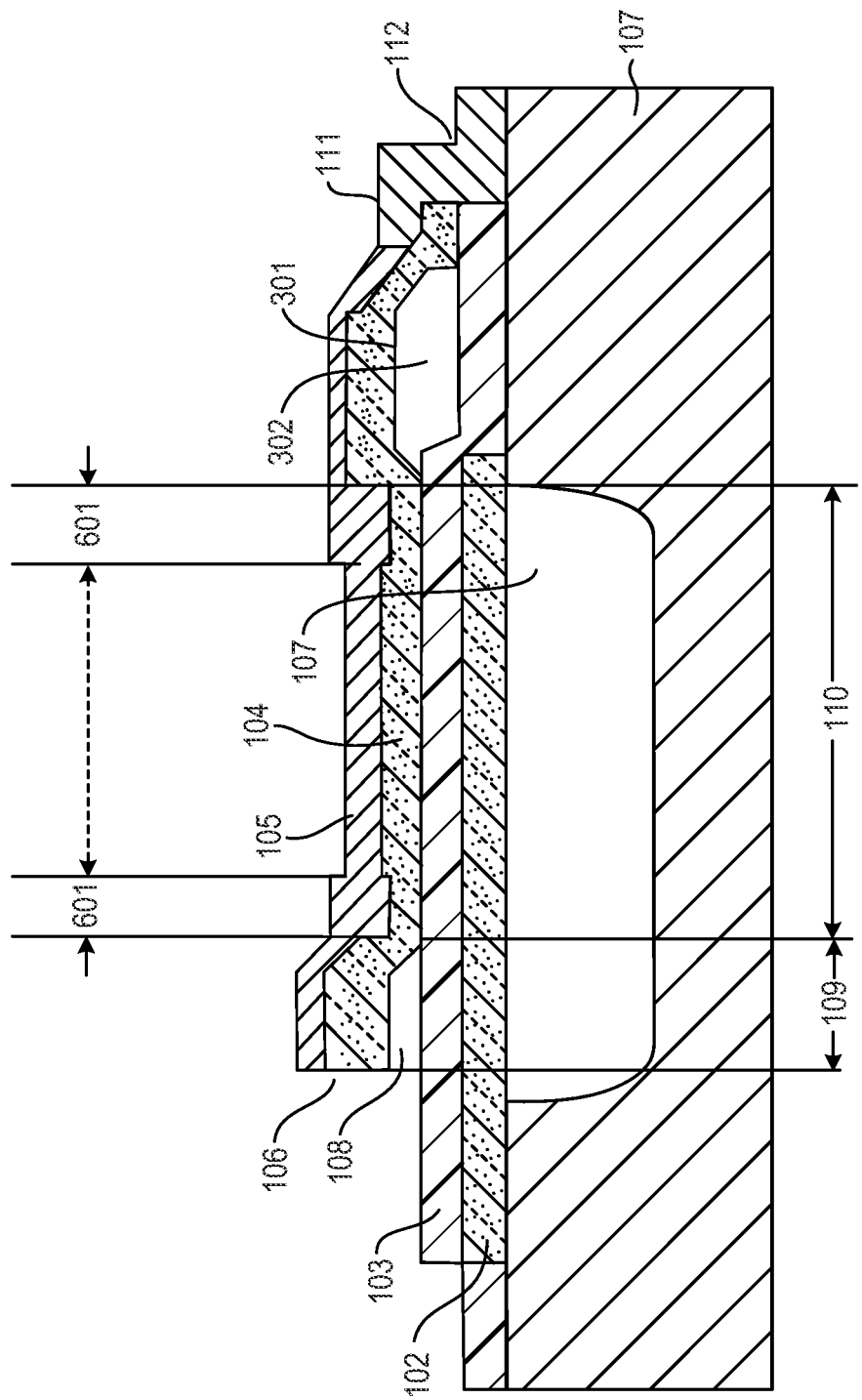
FIG. 6 shows a cross-sectional view of a bulk acoustic wave (BAW) resonator 600 in accordance with a representative embodiment.

FIG. 6 shows a cross-sectional view of a bulk acoustic wave (BAW) resonator 600 in accordance with a representative embodiment. Many of the features of the bulk acoustic wave (BAW) resonator 600 are common to those of bulk acoustic wave (BAW) resonators 100, 300, 500 described in connection with representative embodiments in FIGS. 1A-1B, 3, 5A and 5B. The details of common features, characteristics and benefits thereof are not repeated in order to avoid obscuring the presently described embodiments.

The bulk acoustic wave (BAW) resonator 600 comprises the bridge 301 along the interconnection side 112. The bridge 301 provides the gap 302, which may be a void (e.g., air) or may be filled with a low acoustic impedance material. In addition to the bridge 301, the bulk acoustic wave (BAW) resonator 600 comprises a recessed frame element 601 ('innie'). The recessed frame element 601 may be disposed along one or more sides of the bulk acoustic wave (BAW) resonator 600 and provides an acoustic mismatch at the perimeter of the second electrode 104, thereby improving signal reflections and reducing acoustic losses. Ultimately, reduced losses translate into an improved Q-factor of the device. While the recessed frame element 601 is shown disposed over the second electrode 104, the recessed frame element 601 may instead be provided over the first electrode 102 and beneath the piezoelectric layer 103, or selectively on both the first and second electrodes 102,104. Further details of the use, formation and benefits of the recessed frame element 601 may be found for example, in commonly owned U.S. Pat. No. 7,280,007 entitled "Thin Film Bulk Acoustic Resonator with a Mass Loaded Perimeter" to Feng, et al.; and commonly owned U.S. Patent Application Publication 20070205850 entitled "Piezoelectric Resonator Structure and Electronic Filters having Frame Elements" to Jamneala, et al. The disclosures of this patent and patent application publication are specifically incorporated herein by reference. Moreover, the incorporation of both a raised frame element (e.g., raised frame element 501) and a recessed frame (e.g., recessed frame element 601) in a bulk acoustic wave (BAW) resonator 100, 300, 500, 600 is also contemplated by the present teachings. The incorporation of both raised and recessed frame elements in a bulk acoustic wave (BAW) resonator is disclosed in the parent application (U.S. patent application Ser. No. 12/490,525).

Figure 7:
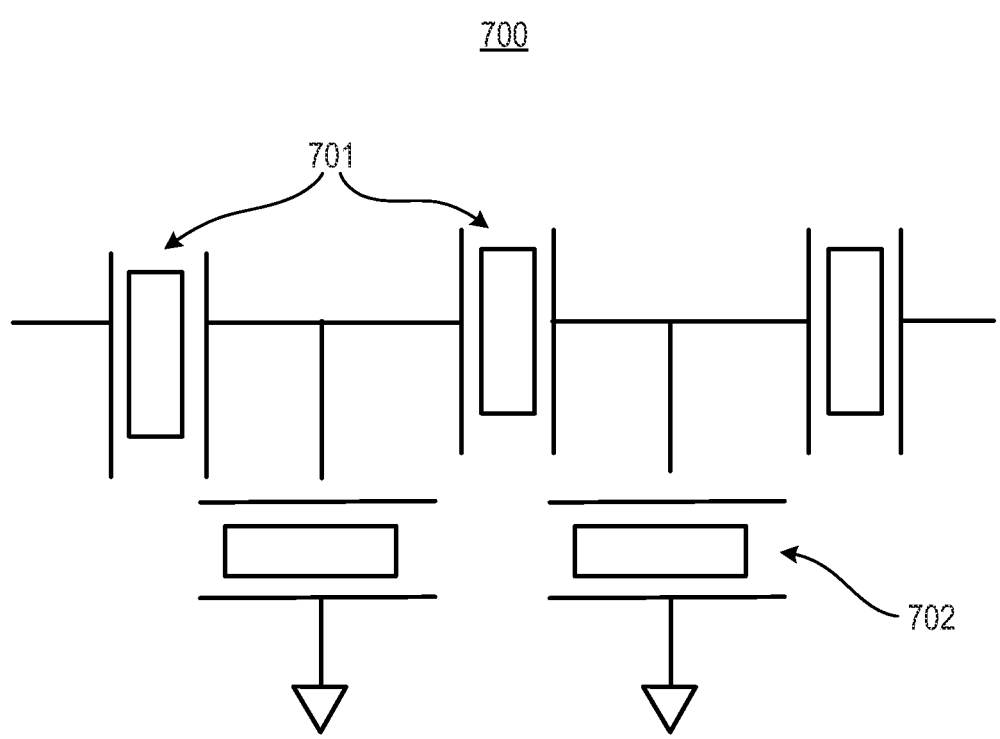
FIG. 7 shows a simplified schematic block diagram of an electrical filter in accordance with a representative embodiment.

When connected in a selected topology, a plurality of bulk acoustic wave (BAW) resonators 100, 300, 500, 600 can function as an electrical filter. FIG. 7 shows a simplified schematic block diagram of an electrical filter 700 in accordance with a representative embodiment. The electrical filter 700 comprises series bulk acoustic wave (BAW) resonators 701 and shunt bulk acoustic wave (BAW) resonators 702. The series resonators 701 and shunt resonators 702 may comprise the bulk acoustic wave (BAW) resonators 100, 300, 500, 600 described in connection with the representative embodiments of FIGS. 1A, 1B, 3, 5A, 5B and 6. The electrical filter 700 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 700 is merely illustrative and other topologies are contemplated. Moreover, the bulk acoustic wave (BAW) resonators of the representative embodiments are contemplated in a variety of applications besides duplexers.

The Piezoelectric Material

Various embodiments relate to providing AlN thin film with an enhanced piezoelectric coefficient d33 and an enhanced electromechanical coupling coefficient $kt^2$ by incorporating multiple rare earth elements into the AlN crystal lattice. By incorporating specific atomic percentages of the multiple rare earth elements, the piezoelectric properties of the AlN, including piezoelectric coefficient d33 and enhanced electromechanical effective coupling coefficient $kt^2$, are improved as compared to stoichiometric AlN.

According to various embodiments, the piezoelectric layer 103 is formed of AlN "doped" with multiple rare earth elements, and has a thickness of approximately 5000 Å to approximately 25000 Å, for example. In particular, a number of Al atoms of the piezoelectric layer 1038 within the AlN crystal lattice are replaced with more than one type of rare earth element at predetermined percentages, referred to as "doping elements." Because the doping elements replace only Al atoms (e.g., of an Al target), the percentage of nitrogen atoms in the piezoelectric layer 103 remains substantially the same regardless of the amount of doping. When percentages of doping elements are discussed herein, it is in reference to the total atoms (including nitrogen) of the AlN piezoelectric layer 103. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any two or more rare earth elements, although specific examples are discussed below.

For purposes of illustration, the piezoelectric layer 103 in FIGS. 1A, 3A and 3B may be formed of AlN doped with scandium (Sc) and erbium (Er). For example, the combined aluminum, scandium and erbium may be sputtered onto a seed layer grown on a top surface of the first electrode 102, or sputtered directly on the top surface of the first electrode 102, in the presence of an argon (Ar)-nitrogen ($N_2$) gas atmosphere inside a reaction chamber. More particularly, in various embodiments, a composite target (or multiple targets) formed of aluminum and desired proportions with scandium and erbium (thus effectively forming an Al—Sc—Er alloy) is provided in the reaction chamber. Application of AC power creates Ar—$N_2$ plasma with which the target reacts, resulting in sputter deposition of nitrogen, aluminum, scandium and erbium atoms in proportionate amounts to the seed layer (or to the top surface of the first electrode 102). The top surface of the first electrode 102 may be previously cleaned using Ar and/or hydrogen ($H_2$) gas. Examples of general AlN sputter deposition processes are provided by U.S. Patent App. Pub. No. 2011/0180391 to Larson, III et al., published on Jul. 28, 2011, which is hereby incorporated by reference in its entirety.

In an embodiment, the target (or multiple targets) formed of aluminum with the desired proportions with rare earth elements (e.g., scandium and erbium) may be a previously formed composite material or alloy of aluminum and the rare earth elements mixed in the desired proportions. In an alternative embodiment, the target may be a composite target formed substantially of aluminum, and the doping elements (e.g., scandium and erbium) are introduced by forming holes in the aluminum target and inserting "plugs" of scandium and erbium into the respective holes in the desired proportions. The percentage of each of the doping elements corresponds to the collective volume of that element inserted into one or more respective holes, which displaces a corresponding volume of aluminum. The size and number of holes, as well as the amount of the doping element filling each of the holes, may be determined on a case-by-case basis, depending on the desired percentages of the doping elements. For example, the holes may be drilled partially or entirely through the aluminum target in the desired sizes and numbers in various patterns. Similarly, in alternative embodiments, the rare earth elements may be added to the aluminum target in the desired proportions using various alternative types of insertions, without departing from the scope of the present teachings. For example, full or partial rings formed of the elements, respectively, may be inlaid in each aluminum target. The number, width, depth and circumference of each ring may be adjusted to provide the desired proportion of each particular element.

In alternative embodiments, the aluminum and doping elements may be sputtered onto the seed layer grown on the top surface of the first electrode 102, or sputtered directly on the top surface of the first electrode 102, using multiple targets formed of the different elements, respectively. For example, an Al—Sc—Er alloy may be applied using an aluminum target, a scandium target and an erbium target separately reacting to the Ar—$N_2$ plasma. The desired proportions of the elements (e.g., the aluminum and the two or more rare earth element dopants) may be obtained by varying the AC power applied to each of the targets and/or the sizes of the targets in relation to one another. Of course, any other process for applying rare earth elements in desired proportions to form a doped piezoelectric layer may be used without departing from the scope of the present teachings.

Generally, the aluminum and nitrogen are proportioned at approximately 50 percent each (i.e., the overall atomic percentage of the Al is approximately 50). As mentioned above, the scandium and erbium replace aluminum atoms (in the AlN crystal lattice), while the proportionate amount of nitrogen stays substantially the same. So, for example, the aluminum target may contain about 5 percent scandium and 5 percent erbium, in which case the aluminum in the doped piezoelectric layer 103 has an atomic percentage of approximately 45, while each of the scandium and the erbium in the piezoelectric layer 103 has an atomic percentage of approximately 2.5. The atomic consistency of the piezoelectric layer 103 may then be represented as $Al_{0.45}N_{0.50}Sc_{0.025}Er_{0.025}$, for example. More generally, the doping level of erbium is in the range of approximately 0.5% to approximately 20.0%.

In various embodiments, the amount of each of the scandium and erbium dopants present in the piezoelectric layer 103 may be less than approximately ten atomic percent, for example. Also, in various embodiments, the amount of each of the scandium and erbium dopants present in the piezoelectric layer 103 may be less than approximately one atomic percent, an example of which is discussed below. Notably, significant improvement in coupling coefficient $kt^2$ is seen in embodiments using even very small amounts of dopants. Also, although described with reference to a piezoelectric layer 103 formed of AlN doped with scandium and erbium, it is understood that the piezoelectric layer 103 may be doped with two or more other rare earth elements in substantially the same manner, without departing from the scope of the present teachings. For example, the piezoelectric layer 103 may be formed of doped AlN, using an Al—Sc—Y alloy, an Al—Er—Y alloy or an Al—Sc—Er—Y alloy, where each of the doping elements has an atomic percentage less than about 10. Also, the general concept of doping the piezoelectric layer 103 with multiple rare earth elements may be applied to other piezoelectric materials, such as zinc oxide (ZnO) or lead zirconate titanate (PZT), without departing from the scope of the present teachings. Table 1 shows percentage improvement in coupling coefficient $k'^2$ of an SMR (e.g., bulk acoustic wave (BAW) resonator 304) having a piezoelectric layer formed of AlN doped with scandium and erbium over a standard SMR having a piezoelectric layer formed only of AlN. Also, for purposes of comparison, Table 1 shows percentage improvements in coupling coefficient $k'^2$ of SMRs having piezoelectric layers formed of AlN doped only with scandium and only with erbium, respectively, over the standard SMR having a piezoelectric layer formed of AlN.

TABLE 1

| Doping Element added to AlN | Atomic concentration in AlN (in percentage) | Improvement in $kt^2$ over Standard AlN (in percentage) |
|---|---|---|
| Erbium only | 0.27% | 0.20% |
| Scandium only | 0.77% | 0.25% |
| Erbium | 0.34% | 0.47% |
| Scandium | 0.63% | |

Atomic concentration is an arithmetic average of Rutherford backscattering spectrometry (RBS) measurements taken at the top, center and bottom of a sample wafer containing the SMR. For orientation purposes, the bottom of the wafer is the major flat of the wafer. Also, the percentage improvement in the coupling coefficient $kt^2$ is the increase in the wafer median above the wafer median for standard AlN (i.e., having no doping elements).

Referring to Table 1, the piezoelectric layer formed of AlN doped with about 0.27 atomic percent erbium provides about a 0.20 percent increase in coupling coefficient $kt^2$ over the standard SMR (having a piezoelectric layer comprising undoped AlN). The piezoelectric layer formed of AlN doped with about 0.77 atomic percent scandium provides about a 0.25 percent increase in coupling coefficient $kt^2$ over the standard SMR. In comparison, the piezoelectric layer formed of AlN doped with about 0.34 atomic percent erbium and about 0.63 atomic percent scandium provides about a 0.47 percent increase in coupling coefficient $kt^2$ over the standard SMR. This indicates that the improvement (increase) in the coupling coefficient $kt^2$ of the piezoelectric layer using AlN doped with two rare earth elements increases substantially over a piezoelectric layer using AlN doped with only one of the same two rare earth elements. Indeed, the AlN doped with scandium and erbium has an approximately 135 percent increase in the coupling coefficient $kt^2$ over the AlN doped only with about the same amount of erbium, and approximately 88 percent increase in the coupling coefficient $kt^2$ over the AlN doped only with about the same amount of scandium.

In another representative embodiment, the piezoelectric layer 103 may be doped with scandium and yttrium. Generally, as noted above, the aluminum and nitrogen are proportioned at approximately 50 percent each (i.e., the overall atomic percentage of the Al is approximately 50). The scandium and yttrium replace aluminum atoms (in the AlN crystal lattice), while the proportionate amount of nitrogen stays substantially the same. So, for example, the aluminum target may contain about 5 percent scandium and 5 percent yttrium in which case the aluminum in the doped piezoelectric layer 103 has an atomic percentage of approximately 45, while the each of the scandium and the erbium in the piezoelectric layer 103 has an atomic percentage of approximately 2.5. The atomic consistency of the piezoelectric layer 103 may then be represented as $Al_{0.45}N_{0.50}Sc_{0.025}Y_{0.025}$, for example. In various embodiments, the amount of each of the scandium and yttrium dopants present in the piezoelectric layer 103 may be less than approximately ten atomic percent, for example. Also, in various embodiments, the amount of each of the scandium and yttrium dopants present in the piezoelectric layer 103 may be less than approximately one atomic percent. More generally, the doping level of yttrium is in the range of approximately 0.5% to approximately 10.0%.

In alternative embodiments, piezoelectric layers doped with two or more rare earth elements may be formed in resonator stacks of various other types of resonator devices, without departing from the scope of the present teachings. For example, a piezoelectric layer doped with two or more rare earth elements may be formed in resonator stacks of a stacked bulk acoustic resonator (SBAR) device, a double bulk acoustic resonator (DBAR) device, or a coupled resonator filter (CRF) device.

In accordance with illustrative embodiments, BAW resonator structures comprising piezoelectric layers formed of materials alloyed with multiple rare earth elements are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

In accordance with illustrative embodiments, bulk acoustic wave (BAW) resonators for various applications such as in electrical filters are described having an electrode comprising a cantilevered portion. Additionally, bulk acoustic wave (BAW) resonators for various applications such as in electrical filters are described having an electrode comprising a cantilevered portion and a bridge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

We claim:

1. An acoustic resonator, comprising:
   a first electrode;
   a second electrode comprising a plurality of sides, wherein at least one of the sides comprises a cantilevered portion;
   a piezoelectric layer disposed between the first and second electrodes, the piezoelectric layer comprising a piezoelectric material doped with a plurality of rare earth elements, wherein the cantilevered portion extends above the piezoelectric layer; and
   a gap between the cantilevered portion and the piezoelectric layer.

2. An acoustic resonator as claimed in claim 1, further comprising a reflective element disposed beneath the first electrode, the second electrode and the piezoelectric layer, wherein a contacting overlap of the reflective element, the first electrode, the second electrode and the piezoelectric layer defines an active area of the acoustic resonator.

3. An acoustic resonator as claimed in claim 2, wherein the cantilevered portion of the second electrode extends beyond a termination of the active area.

4. An acoustic resonator as claimed in claim 2, further comprising a bridge adjacent to a termination of the active area of the acoustic resonator.

5. An acoustic resonator as claimed in claim 4, wherein the gap is a first gap, and the bridge comprises a second gap, which exists in a region between the second electrode and the piezoelectric layer.

6. An acoustic resonator as claimed in claim 2, further comprising a frame element.

7. An acoustic resonator as claimed in claim 6, wherein the frame element is a recessed frame element.

8. An acoustic resonator as claimed in claim 6, wherein the frame element comprises a raised frame element.

9. An acoustic resonator as claimed in claim 1, wherein all but one of the plurality of sides of the second electrode comprises the cantilevered portion.

10. An acoustic resonator as claimed in claim 9, further comprising an electrical connection to the one of the plurality of sides of the second electrode that does not comprise a cantilevered portion.

11. An acoustic resonator as claimed in claim 1, wherein the piezoelectric material comprises aluminum nitride (AlN).

12. An acoustic resonator as claimed in claim 11, wherein the plurality of rare earth elements comprises two rare earth elements incorporated into a crystal lattice of the AlN piezoelectric material.

13. An acoustic resonator as claimed in claim 12, wherein the plurality of rare earth elements comprises scandium (Sc) and erbium (Er).

14. An acoustic resonator as claimed in claim 13, wherein the plurality of rare earth elements further comprises yttrium (Y).

15. An acoustic resonator as claimed in claim 13, wherein a concentration of each of the scandium and the erbium is less than approximately 10 atomic percent of the piezoelectric material.

16. An acoustic resonator as claimed in claim 15, wherein the concentration of each of the scandium and the erbium is less than approximately one atomic percent of the piezoelectric material.

17. An acoustic resonator as claimed in claim 16, wherein the concentration of scandium is approximately 0.63 atomic percent of the piezoelectric material, and the concentration of erbium is approximately 0.34 atomic percent of the piezoelectric material.

18. An acoustic resonator as claimed in claim 11, wherein the plurality of rare earth elements comprises more than two rare earth elements incorporated into a crystal lattice of the AlN piezoelectric material.

19. An acoustic resonator as claimed in claim 11, wherein the piezoelectric layer is provided using a target formed of an alloy comprising aluminum and the plurality of doping elements, and sputtering the aluminum alloy from the target over the bottom electrode using a plasma comprising nitrogen.

20. An acoustic resonator as claimed in claim 1, wherein the piezoelectric layer is provided using a plurality of targets formed of aluminum and the plurality of doping elements, respectively, and sputtering the aluminum and the plurality of doping elements from the corresponding targets over the bottom electrode using a plasma comprising nitrogen.

21. A microelectromechanical system (MEMS) device comprising the acoustic resonator of claim 1.

22. An acoustic resonator, comprising:
a first electrode;
a second electrode comprising a plurality of sides, wherein at least one of the sides comprises a cantilevered portion;
a piezoelectric layer disposed between the first and second electrodes, the piezoelectric layer comprising a piezoelectric material doped with a plurality of rare earth elements, wherein the cantilevered portion extends above the piezoelectric layer;
a reflective element disposed beneath the first electrode, the second electrode and the piezoelectric layer, a contacting overlap of the reflective element, the first electrode, the second electrode and the piezoelectric layer defining an active area of the acoustic resonator, wherein the first electrode substantially covers the reflective element, and the piezoelectric layer extends over an edge of the first electrode; and
a bridge disposed adjacent to a termination of the active area of the acoustic resonator, the bridge extending past an edge of the reflective element.

23. An acoustic resonator as claimed in claim 22, wherein the cantilevered portion of the second electrode extends beyond a termination of the active area.

24. An acoustic resonator as claimed in claim 22, further comprising a frame element.

25. An acoustic resonator as claimed in claim 24, wherein the frame element is a recessed frame element.

26. An acoustic resonator as claimed in claim 24, wherein the frame element comprises a raised frame element.

27. An acoustic resonator as claimed in claim 22, wherein the bridge comprises a gap, and the gap exists in a region between the second electrode and the piezoelectric layer.

28. An acoustic resonator as claimed in claim 22, wherein all but one of the plurality of sides of the second electrode comprise the cantilevered portion.

29. An acoustic resonator as claimed in claim 22, wherein the piezoelectric material comprises aluminum nitride (AlN).

30. An acoustic resonator as claimed in claim 29, wherein the plurality of rare earth elements comprises two rare earth elements incorporated into a crystal lattice of the AlN piezoelectric material.

31. An acoustic resonator as claimed in claim 22, wherein the plurality of rare earth elements comprises more than two rare earth elements incorporated into a crystal lattice of the AlN piezoelectric material.

32. An acoustic resonator as claimed in claim 22, wherein the plurality of rare earth elements comprises scandium (Sc) and erbium (Er).

33. An acoustic resonator as claimed in claim 32, wherein the plurality of rare earth elements further comprises yttrium (Y).

34. An acoustic resonator as claimed in claim 32, wherein a concentration of each of the scandium and the erbium is less than approximately 10 atomic percent of the piezoelectric material.

35. An acoustic resonator as claimed in claim 34, wherein the concentration of each of the scandium and the erbium is less than approximately one atomic percent of the piezoelectric material.

36. An acoustic resonator as claimed in claim 35, wherein the concentration of scandium is approximately 0.63 atomic percent of the piezoelectric material, and the concentration of erbium is approximately 0.34 atomic percent of the piezoelectric material.

37. An acoustic resonator as claimed in claim 22, wherein the piezoelectric layer is provided using a target formed of an alloy comprising aluminum and the plurality of doping elements, and sputtering the aluminum alloy from the target over the bottom electrode using a plasma comprising nitrogen.

38. An acoustic resonator as claimed in claim 22, wherein the piezoelectric layer is provided using a plurality of targets formed of aluminum and the plurality of doping elements, respectively, and sputtering the aluminum and the plurality of doping elements from the corresponding targets over the bottom electrode using a plasma comprising nitrogen.

39. A microelectromechanical system (MEMS) device comprising the acoustic resonator of claim 22.

* * * * *